United States Patent
Kim et al.

(10) Patent No.: US 12,394,760 B2
(45) Date of Patent: Aug. 19, 2025

(54) COLOR CHANGING SUBSTRATE AND DISPLAY DEVICE INCLUDING THE SAME

(71) Applicant: SAMSUNG DISPLAY CO., LTD., Yongin-si (KR)

(72) Inventors: Ji Yoon Kim, Seongnam-si (KR); Chang Hee Lee, Seoul (KR); Se Hun Kim, Yongin-si (KR); Young Mo Koo, Suwon-si (KR); Jae Kook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 578 days.

(21) Appl. No.: 17/702,659

(22) Filed: Mar. 23, 2022

(65) Prior Publication Data

US 2023/0006112 A1    Jan. 5, 2023

(30) Foreign Application Priority Data

Jun. 17, 2021    (KR) ......................... 10-2021-0078471

(51) Int. Cl.
| | | |
|---|---|---|
| H01L 25/075 | (2006.01) | |
| G02B 5/00 | (2006.01) | |
| G02B 5/20 | (2006.01) | |
| H01L 25/16 | (2023.01) | |
| H10H 20/851 | (2025.01) | |

(Continued)

(52) U.S. Cl.
CPC .......... *H01L 25/0753* (2013.01); *G02B 5/003* (2013.01); *G02B 5/201* (2013.01); *H01L 25/167* (2013.01); *H10H 20/8514* (2025.01); *H10H 20/856* (2025.01); *H10K 50/856* (2023.02); *H10K 59/38* (2023.02); *H10K 59/878* (2023.02); *H10K 59/8792* (2023.02); *B05D 5/065* (2013.01); *H01L 24/24* (2013.01); *H01L 2224/24147* (2013.01); *H10H 20/825* (2025.01);

(Continued)

(58) Field of Classification Search
None
See application file for complete search history.

(56) References Cited

U.S. PATENT DOCUMENTS 10,236,328 B2    3/2019  Kim et al.
11,450,715 B2 *  9/2022  Kim .................... H10K 50/84
(Continued)

FOREIGN PATENT DOCUMENTS

JP    4581368 B2    11/2010
JP    2015-064391 A    4/2015
(Continued)

*Primary Examiner* — Hung K Vu
(74) *Attorney, Agent, or Firm* — Womble Bond Dickinson (US) LLP

(57) ABSTRACT

A color changing substrate comprises a substrate comprising emission areas and non-emission areas, a color filter layer on the substrate and comprising a light blocking member partitioning the emission areas and the non-emission areas, and a plurality of color filters in areas surrounded by the light blocking member, a bank overlapping the light blocking member, a wavelength control layer comprising wavelength conversion layers and a light transmitting layer in areas surrounded by the bank, a reflective layer overlapping the bank, a first metal oxide layer overlapping the reflective layer, and a self-assembled layer overlapping the first metal oxide layer.

18 Claims, 15 Drawing Sheets

(51) Int. Cl.
  *H10H 20/856*   (2025.01)
  *H10K 50/856*   (2023.01)
  *H10K 59/38*    (2023.01)
  *H10K 59/80*    (2023.01)
  *B05D 5/06*         (2006.01)
  *H01L 23/00*        (2006.01)
  *H10H 20/80*        (2025.01)
  *H10H 20/825*       (2025.01)
  *H10K 59/122*       (2023.01)
  *H10K 102/00*       (2023.01)

(52) U.S. Cl.
  CPC ......... *H10H 20/882* (2025.01); *H10K 59/122* (2023.02); *H10K 2102/351* (2023.02)

(56) References Cited

U.S. PATENT DOCUMENTS

| | | |
|---|---|---|
| 11,621,305 B2 | 4/2023 | Park et al. |
| 2017/0153366 A1 | 6/2017 | Park et al. |
| 2021/0020725 A1* | 1/2021 | Park .................... H10K 59/121 |
| 2021/0399068 A1* | 12/2021 | Kim ................... H10K 59/8792 |

FOREIGN PATENT DOCUMENTS

| | | | |
|---|---|---|---|
| KR | 2007-0071903 A | 7/2007 |
| KR | 10-2015-0027973 A | 3/2015 |
| KR | 10-2018-0108948 A | 10/2018 |
| KR | 10-2021-0031586 A | 3/2021 |

* cited by examiner

COLOR CHANGING SUBSTRATE AND DISPLAY DEVICE INCLUDING THE SAME

CROSS-REFERENCE TO RELATED APPLICATION

This application claims priority to and the benefit of Korean Patent Application No. 10-2021-0078471 filed on Jun. 17, 2021 in the Korean Intellectual Property Office, the entire content of which is herein incorporated by reference.

BACKGROUND

1. Field

One or more embodiments of the present disclosure relate to a color changing substrate and a display device including the same.

2. Description of the Related Art

The importance of display devices has increased with the development of multimedia. Accordingly, various display devices, such as an organic light emitting display (OLED) and a liquid crystal display (LCD), have been used.

The display devices are devices for displaying images, and include display panels such as organic light emitting display panels and/or liquid crystal display panels. Among them, the light emitting display panel may include a light emitting element such as a light emitting diode (LED), and examples of such light emitting diode include an organic light emitting diode (OLED) that uses an organic material as a light emitting material, an inorganic light emitting diode that uses an inorganic material as a light emitting material, and the like.

SUMMARY

Aspects of one or more embodiments of the present disclosure are directed towards a display device capable of improving light extraction efficiency and preventing or reducing color mixing.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the disclosure, a color changing substrate comprises a substrate including emission areas and non-emission areas, a color filter layer on the substrate and including a light blocking member partitioning the emission areas and the non-emission areas, and color filters in areas surrounded by the light blocking member, a bank overlapping the light blocking member, a wavelength control layer including wavelength conversion layers and a light transmitting layer in areas surrounded by the bank, a reflective layer overlapping the bank, a first metal oxide layer overlapping the reflective layer, and a self-assembled layer overlapping the first metal oxide layer.

In one or more embodiments, the first metal oxide layer covers the reflective layer, and the self-assembled layer covers the first metal oxide layer.

In one or more embodiments, the reflective layer, the first metal oxide layer, and the self-assembled layer overlap the non-emission areas and do not overlap the emission areas.

In one or more embodiments, the reflective layer, the first metal oxide layer, and the self-assembled layer overlap the light blocking member.

In one or more embodiments, the first metal oxide layer includes any one selected from ITO, IZO, ZnO, $In_2O_3$, and ITZO.

In one or more embodiments, the first metal oxide layer has a thickness in a range of about 10 Å to about 500 Å.

In one or more embodiments, the color changing substrate further comprises a second metal oxide layer between the bank and the reflective layer, wherein the second metal oxide layer includes the same material as the first metal oxide layer.

In one or more embodiments, the self-assembled layer includes a compound including hydrocarbon chains, head portions at first ends of the respective hydrocarbon chains, and terminal portions at second ends of the respective hydrocarbon chains.

In one or more embodiments, the head portions are in contact with a surface of the first metal oxide layer, and the terminal portions are spaced apart from the first metal oxide layer in a direction away from the first metal oxide layer.

In one or more embodiments, the compound is represented by the following Chemical Formula 1:

wherein A is one or more selected from the group consisting of a thiol group, a disulfide group, a carboxylic acid group, a phosphonic acid group, and a silane group, B is one or more selected from the group consisting of a fluoroalkylene group, an alkylene group, an acylene group, an amine group, a carboxylic acid group, a thiol group, and an ether group, C is one or more selected from the group consisting of a fluoroalkyl group, an alkyl group, an acyl group, an amine group, a carboxylic acid group, a thiol group, and an alcohol group, B includes one or more fluoro groups, and C includes one or more fluoro groups.

According to one or more embodiments of the disclosure, a display device comprises a display substrate comprising a first substrate including sub-pixels and a light emitting element layer on the first substrate and configured to emit light, and a color changing substrate on the display substrate, wherein the color changing substrate includes a second substrate including emission areas and non-emission areas respectively corresponding to the sub-pixels, a color filter layer on one surface of the second substrate facing the first substrate and including a light blocking member partitioning the emission areas and the non-emission areas and color filters in areas surrounded by the light blocking member, a bank overlapping the light blocking member, a wavelength control layer including wavelength conversion layers and a light transmitting layer in areas surrounded by the bank, a reflective layer overlapping the bank, a metal oxide layer overlapping the reflective layer, and a self-assembled layer overlapping the metal oxide layer.

In one or more embodiments, the light emitting element layer includes pixel electrodes, a pixel defining layer partitioning the emission areas and the non-emission areas on the pixel electrodes, light emitting layers on the pixel electrodes, and a common electrode on the light emitting layers.

In one or more embodiments, the bank, the reflective layer, the metal oxide layer, and the self-assembled layer overlap the pixel defining layer, and overlap the non-emission areas.

In one or more embodiments, the sub-pixels include a first sub-pixel, a second sub-pixel, and a third sub-pixel, the wavelength conversion layers include a first wavelength conversion layer in the first sub-pixel and a second wavelength conversion layer in the second sub-pixel, and the light transmitting layer is in the third sub-pixel In one or more embodiments, the plurality of color filters includes a first color filter in the first sub-pixel, a second color filter in the second sub-pixel, and a third color filter in the third sub-pixel, and the light emitted from the light emitting element layer is to be converted into light of a first color in the first wavelength conversion layer and then is to be emitted through the first color filter, is to be converted into light of a second color in the second wavelength conversion layer and then is to be emitted through the second color filter, or is to be transmitted through the light transmitting layer and then is to be emitted through the third color filter.

In one or more embodiments, the metal oxide layer includes any one selected from ITO, IZO, ZnO, $In_2O_3$, and ITZO.

In one or more embodiments, the self-assembled layer includes a compound including hydrocarbon chains, head portions at first ends of the respective hydrocarbon chains, and terminal portions at second ends of the respective hydrocarbon chains, the head portions are in contact with a surface of the metal oxide layer, and the terminal portions are spaced apart from the metal oxide layer in a direction away from the metal oxide layer.

In one or more embodiments, the compound is represented by the following Chemical Formula 1:

A-B-C    Chemical Formula 1 wherein A is one or more selected from the group consisting of a thiol group, a disulfide group, a carboxylic acid group, a phosphonic acid group, and a silane group, B is one or more selected from the group consisting of a fluoroalkylene group, an alkylene group, an acylene group, an amine group, a carboxylic acid group, a thiol group, and an ether group, C is one or more selected from the group consisting of a fluoroalkyl group, an alkyl group, an acyl group, an amine group, a carboxylic acid group, a thiol group, and an alcohol group, B includes one or more fluoro groups, and C includes one or more fluoro groups.

According to one or more embodiments of the disclosure, a display device comprises a substrate including sub-pixels, a bank on the substrate at boundaries between the sub-pixels, a wavelength control layer including wavelength conversion layers in areas surrounded by the bank and a light transmitting layer in the sub-pixels, a color filter layer overlapping the wavelength control layer, a light emitting element layer between the substrate and the wavelength control layer and including light emitting elements and connection electrodes connected to respective ends of the respective light emitting elements, a reflective layer between the bank and the wavelength control layer, and overlapping the bank, a metal oxide layer overlapping the reflective layer, and a self-assembled layer overlapping the metal oxide layer.

In one or more embodiments, the metal oxide layer includes any one selected from ITO, IZO, ZnO, $In_2O_3$, and ITZO, and the self-assembled layer includes a compound including hydrocarbon chains, head portions at first ends of the respective hydrocarbon chains, and terminal portions at second ends of the respective hydrocarbon chains, and the head portions are in contact with a surface of the metal oxide layer, and the terminal portions are spaced apart from the metal oxide layer in a direction away from the metal oxide layer.

With the color changing substrate and the display device according to embodiments, light extraction efficiency may be improved by forming the reflective layer on the bank to prevent or reduce the absorption of light into the bank.

In addition, color mixing may be prevented or reduced by forming the metal oxide layer and the self-assembled layer on the bank to prevent or reduce the overflow of ink into adjacent sub-pixels during an inkjet process for forming the wavelength control layer.

The effects of the present disclosure are not limited to the aforementioned effects, and various other effects are included in the present specification.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
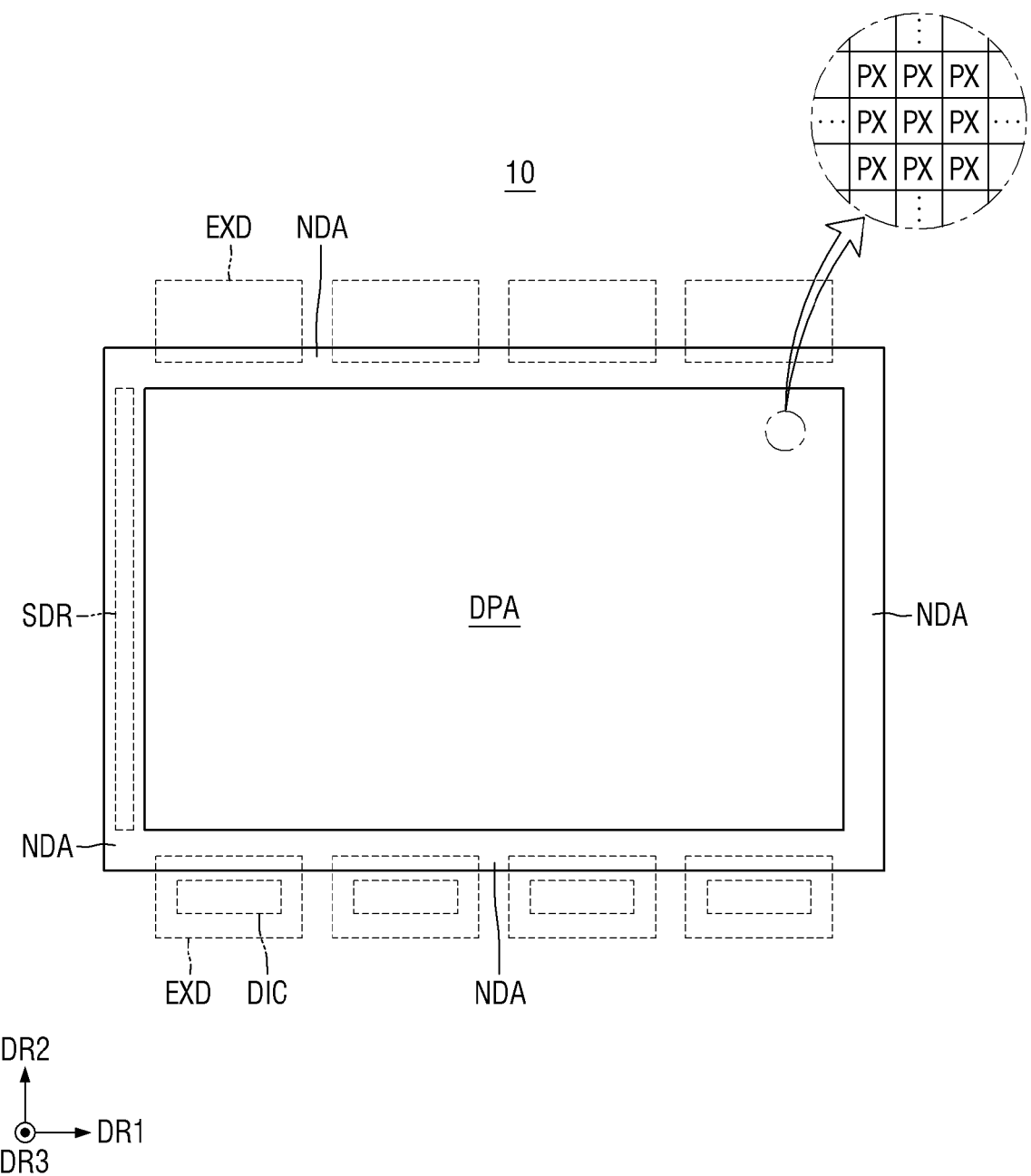
FIG. 1 is a schematic plan view illustrating a display device according to one or more embodiments.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to or different from the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

As used herein, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

Each of the features of the various embodiments of the present disclosure may be combined or combined with each other, in part or in whole, and technically various interlocking and driving are possible. The embodiments may be implemented independently of each other or may be implemented together in an association.

Hereinafter, embodiments will be described with reference to the accompanying drawings.

FIG. 1 is a schematic plan view illustrating a display device according to one or more embodiments.

Referring to FIG. 1, a display device 10 according to one or more embodiments may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle dashboards, digital cameras, camcorders, external billboards, electric signs, medical devices, inspection devices, various home appliances such as refrigerators and washing machines, and/or Internet of Things (IoT) devices. In the present specification, a television (TV) will be described as an example of the display device, and the TV may have high resolution or ultra-high resolution such as high definition (HD), ultra-high definition (UHD), 4K, or 8K.

In addition, the display device 10 according to one or more embodiments may be variously classified according to a display method. For example, classification of the display device may include an organic light emitting display (OLED), an inorganic light emitting display (inorganic EL), a quantum dot light emitting display (QED), a micro LED display (micro-LED), a nano LED display (nano-LED), a plasma display panel (PDP), a field emission display (FED), a cathode ray tube display (CRT), a liquid crystal display (LCD), an electrophoretic display (EPD), and the like. Hereinafter, an organic light emitting display and an inorganic light emitting display will be described as examples of the display device, and the organic light emitting display and the inorganic light emitting display as applied to one or more embodiments will be simply referred to as a display device unless they need to be specially distinguished from each other. However, one or more embodiments of the present disclosure are not limited thereto, and other display devices listed above or any suitable display device in the art may be applied within the scope of the technical idea of the present disclosure.

Hereinafter, a first direction DR1, a second direction DR2, and a third direction DR3 are defined in the drawings for describing the display device 10 of one or more embodiments. The first direction DR1 and the second direction DR2 may be directions crossing (e.g., perpendicular or substantially perpendicular) to each other in one plane. The third direction DR3 may be a direction crossing (e.g., perpendicular or substantially perpendicular) to the plane in which the first direction DR1 and the second direction DR2 are positioned. For example, the third direction DR3 is perpendicular to each of the first direction DR1 and the second direction DR2. In one or more embodiments for describing the display device 10, the third direction DR3 refers to a thickness direction of the display device 10.

The display device 10 may have a rectangular shape including long sides and short sides, in plan view, with the long sides being in the first direction DR1 and longer than the short sides being in the second direction DR2. A corner portion where the long side and the short side of the display device 10 meet in plan view may be right-angled, but is not limited thereto, and may have a rounded curved shape. The shape of the display device 10 in plan view is not limited to that described above, and may be selected from other suitable shapes such as a square shape, a quadrangular shape with rounded corners (vertices), a polygonal shape, and a circular shape.

A display surface of the display device 10 may be on one side in the third direction DR3, which is the thickness direction. In embodiments for describing the display device 10, unless otherwise stated, "upper portion" denotes one side of the display device 10 in the third direction DR3 and refers to a display direction, and "upper surface" refers to a surface facing the one side in the third direction DR3. In addition, "lower portion" denotes the other side of the display device 10 (opposite the one side) in the third direction DR3 and refers to a direction opposite to the display direction, and "lower surface" refers to a surface facing the other side in the third direction DR3. In addition, "left", "right", "upper", and "lower" refer to directions when the display device 10 is viewed in plan view. For example, "right side" refers to one side in the first direction DR1, "left side" refers to the other side in the first direction DR1, "upper side" refers to one side in the second direction DR2, and "lower side" refers to the other side in the second direction DR2.

The display device 10 may include a display area DPA and a non-display area NDA. The display area DPA may be an active area in which an image is displayed, and the non-display area NDA may be an inactive area in which an image is not displayed.

A shape of the display area DPA may be similar to an overall shape of the display device 10. For example, the display area DPA may have a rectangular shape in plan view. The display area DPA may occupy substantially the center of the display device 10.

The display area DPA may include a plurality of pixels PX. The plurality of pixels PX may be arranged in a matrix orientation. A shape of each pixel PX may be a rectangular or square shape in plan view. However, the present disclosure is not limited thereto, and the shape of each pixel PX may be a rhombic shape in which each side is inclined with respect to one direction. The respective pixels PX may be alternately arranged with each other in a stripe pattern or a PenTile®/PENTILE® pattern (PENTILE® is a registered trademark owned by Samsung Display Co., Ltd.).

The non-display area NDA may be around the display area DPA. The non-display area NDA may entirely or partially surround the display area DPA. The display area DPA may have a rectangular shape, and the non-display area NDA may be adjacent to four sides of the display area DPA. The non-display area NDA may constitute a bezel of the display device 10.

A driving circuit or a driving element for driving the display area DPA may be in the non-display area NDA. In one or more embodiments, pad parts may be provided on a display substrate of the display device 10 in a first non-display area NDA adjacent to a first long side (lower side in FIG. 1) of the display device 10 and in a second non-display area NDA adjacent to a second long side (upper side in FIG. 1) of the display device 10, and external devices EXD may be mounted on pad electrodes of the pad parts. Examples of the external devices EXD may include a connection film, a printed circuit board, a driving chip (DIC), a connector, a wiring connection film, and the like. A scan driver SDR and/or the like formed directly on the display substrate of the display device 10 may be in a third non-display area NDA adjacent to a first short side (left side in FIG. 1) of the display device 10.

Figure 2:
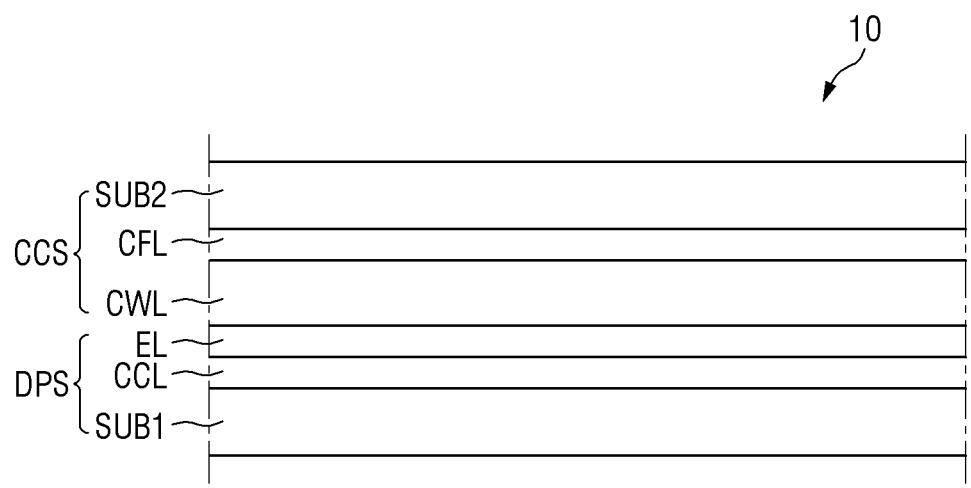
FIG. 2 is a schematic cross-sectional view illustrating the display device according to one or more embodiments.
Figure 3:
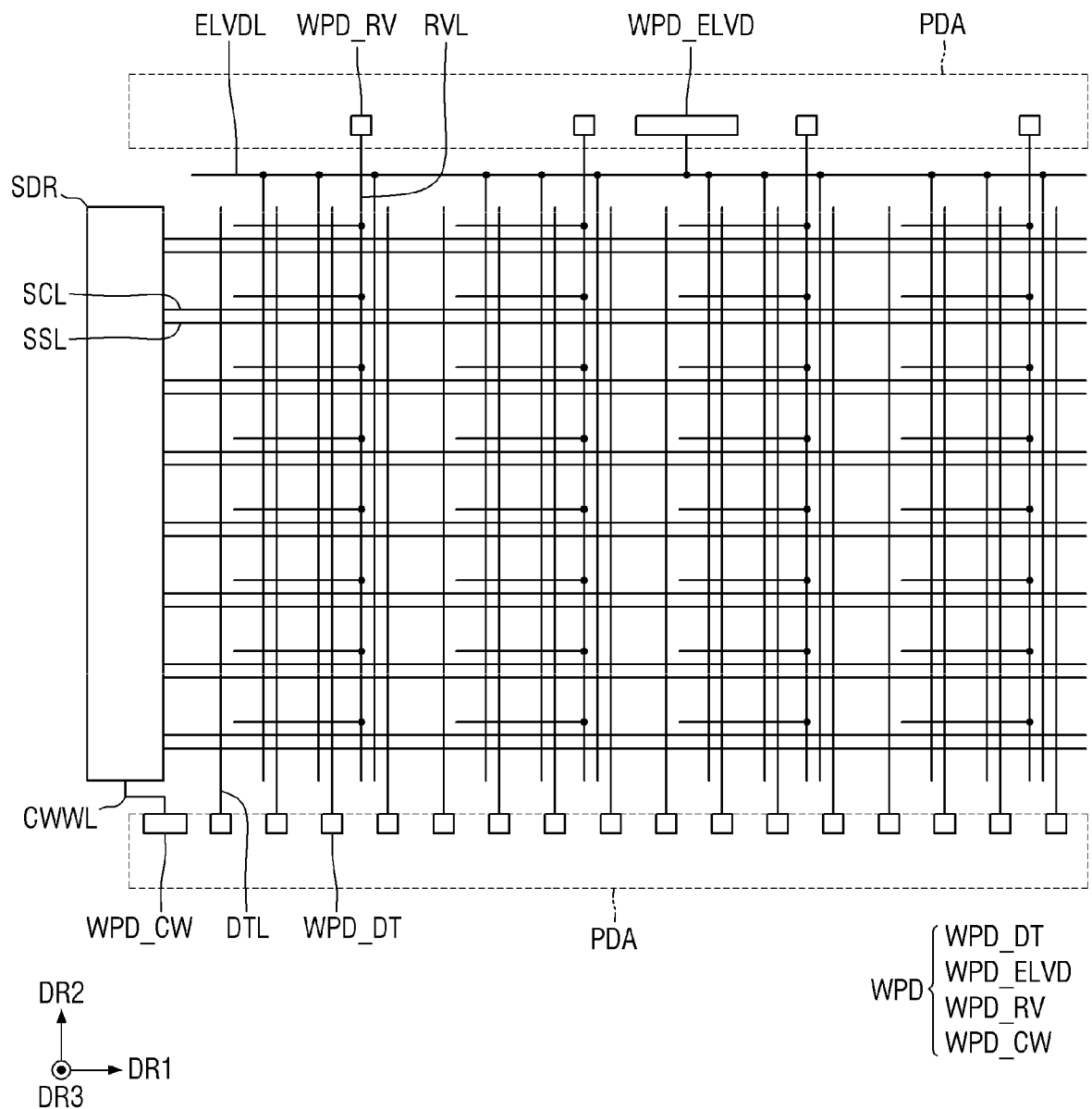
FIG. 3 is a schematic plan view illustrating a circuit layer of the display device according to one or more embodiments.
Figure 4:
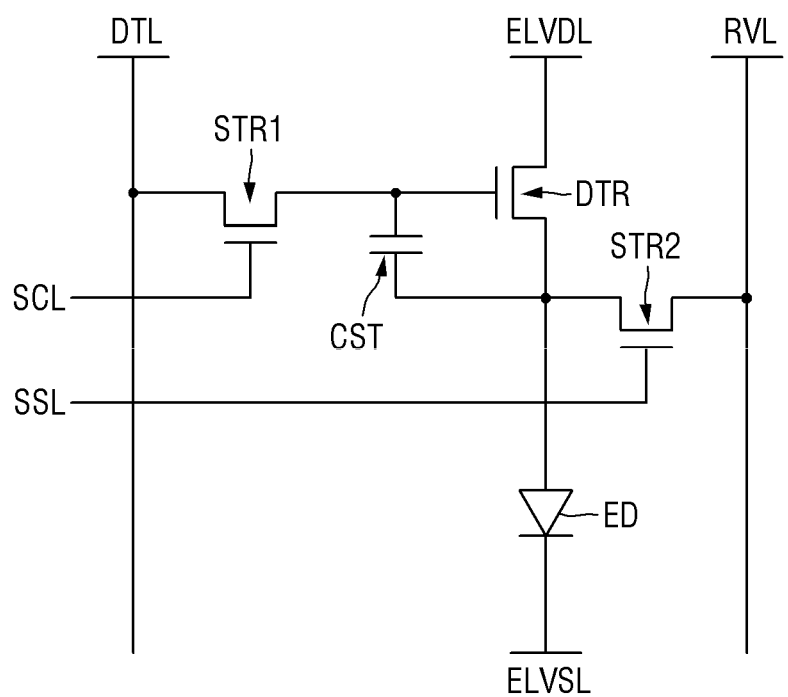
FIG. 4 is an equivalent circuit diagram of one sub-pixel of the display device according to one or more embodiments.

FIG. 2 is a schematic cross-sectional view illustrating the display device according to one or more embodiments. FIG. 3 is a schematic plan view illustrating a circuit layer of the display device according to one or more embodiments. FIG. 4 is an equivalent circuit diagram of one sub-pixel of the display device according to one or more embodiments.

Referring to FIG. 2, the display device 10 according to one or more embodiments may include a display substrate DPS and a color changing substrate CCS. The display substrate DPS may include a first substrate SUB1, a circuit layer CCL on the first substrate SUB1, and a light emitting element layer EL on the circuit layer CCL, and the color changing substrate CCS may include a wavelength control layer CWL, a color filter layer CFL on the wavelength control layer CWL, and a second substrate SUB2 on the color filter layer CFL.

Referring to FIG. 3, the circuit layer CCL of the display substrate DPS may include a plurality of wirings on the first substrate SUB1. The plurality of wirings may include scan lines SCL, sensing signal lines SSL, data lines DTL, reference voltage lines RVL, and a first power line ELVDL.

The scan lines SCL and the sensing signal lines SSL may extend in the first direction DR1. The scan lines SCL and the sensing signal lines SSL may be connected (e.g., electrically and/or physically coupled) to the scan driver SDR. The scan driver SDR may include a driving circuit formed of the circuit layer CCL. The scan driver SDR may be in the third non-display area NDA on the first substrate SUB1, but is not limited thereto, and may be in the fourth non-display area NDA or be in both the third non-display area NDA and the fourth non-display area NDA. The scan driver SDR may be connected to a signal connection wiring CWWL, and at least one end of the signal connection wiring CWWL may be connected to the external device EXD (see FIG. 1) by forming a pad WPD_CW on the first non-display area NDA and/or the second non-display area NDA.

The data lines DTL and the reference voltage lines RVL may extend in the second direction DR2 crossing the first direction DR1. The first power line ELVDL may include portions extending in the second direction DR2. The first power line ELVDL may further include portions extending in the first direction DR1. The first power line ELVDL may have a mesh structure, but is not limited thereto.

Wiring pads WPD may be at at least one end(s) of the data lines DTL, the reference voltage lines RVL, and the first power line ELVDL. Each wiring pad WPD may be in a pad area PDA of the non-display area NDA. In one or more embodiments, wiring pads WPD_DT (hereinafter, referred to as "data pads") of the data lines DTL may be in a pad area PDA of the first non-display area NDA, and wiring pads WPD_RV (hereinafter, referred to as "reference voltage pads") of the reference voltage lines RVL and a wiring pad WPD_ELVD (hereinafter, referred to as a "first power pad") of the first power line ELVDL may be in a pad area PDA of the second non-display area NDA. In one or more embodiments, all of the data pads WPD_DT, the reference voltage pads WPD_RV, and the first power pad WPD_ELVD may be in the same area, for example, the first non-display area NDA. As described above, the external device EXD (see FIG. 1) may be mounted on the wiring pad WPD. The external device EXD may be mounted on the wiring pad WPD through an anisotropic conductive film, ultrasonic bonding, and/or the like.

Each pixel PX on the first substrate SUB1 includes a plurality of sub-pixels, and the plurality of sub-pixels includes pixel driving circuits, respectively. The above-described wirings may apply driving signals to the respective pixel driving circuits while passing around the respective pixels PX and/or the respective sub-pixels. The pixel driving circuit may include a transistor and a capacitor. The numbers of transistors and capacitors in each pixel driving circuit may be variously suitably modified. Hereinafter, the pixel driving circuit will be described using a 3T1C structure in which the pixel driving circuit includes three transistors and one capacitor as an example, but the present disclosure is not limited thereto, and structures of various other suitable examples such as a 2T1C structure, a 7T1C structure, and/or a 6T1C structure may be applied.

FIG. 4 is an equivalent circuit diagram of one sub-pixel of the display device according to one or more embodiments.

Referring to FIG. 4, each pixel PX of the display device according to one or more embodiments includes a plurality of sub-pixels, and each of the plurality of sub-pixels includes three transistors DTR, STR1, and STR2 and one storage capacitor CST, in addition to a light emitting element ED.

The light emitting element ED emits light according to a current supplied through a driving transistor DTR. The light emitting element ED may be implemented as an organic light emitting diode, a micro light emitting diode, a nano light emitting diode, and/or the like.

A first electrode (e.g., an anode electrode) of the light emitting element ED may be connected (e.g., electrically and/or physically coupled) to the source electrode of the driving transistor DTR, and a second electrode (e.g., a cathode electrode) of the light emitting element ED may be connected to a second power line ELVSL to which a low potential voltage (second source voltage) lower than a high potential voltage (first source voltage) of the first power line ELVDL is supplied.

The driving transistor DTR adjusts a current flowing from the first power line ELVDL, to which the first source voltage is supplied, to the light emitting element ED, according to a voltage difference between a gate electrode and the source electrode thereof. The gate electrode of the driving transistor DTR may be connected to a first source/drain electrode of a first switching transistor STR1, the source electrode of the driving transistor DTR may be connected to the first electrode of the light emitting element ED, and a drain electrode of the driving transistor DTR may be connected to the first power line ELVDL to which the first source voltage is applied.

The first switching transistor STR1 is turned on by a scan signal of the scan line SCL to connect the data line DTL to the gate electrode of the driving transistor DTR. A gate electrode of the first switching transistor STR1 may be connected to the scan line SCL, the first source/drain electrode of the first switching transistor STR1 may be connected to the gate electrode of the driving transistor DTR1, and a second source/drain electrode of the first switching transistor STR1 may be connected to the data line DTL.

A second switching transistor STR2 is turned on by a sensing signal of the sensing signal line SSL to connect the reference voltage line RVL to the source electrode of the driving transistor DTR. A gate electrode of the second switching transistor STR2 may be connected to the sensing signal line SSL, a first source/drain electrode of the second switching transistor STR2 may be connected to the reference voltage line RVL, and a second source/drain electrode of the second switching transistor STR2 may be connected to the source electrode of the driving transistor DTR.

In one or more embodiments, the first source/drain electrode of each of the first and second switching transistors STR1 and STR2 may be a source electrode, and the second source/drain electrode of each of the first and second switching transistors STR1 and STR2 may be a drain electrode, but the present disclosure is not limited thereto, and vice versa.

The capacitor CST is formed between the gate electrode and the source electrode of the driving transistor DTR. The storage capacitor CST stores a difference voltage between a gate voltage and a source voltage of the driving transistor DTR.

The driving transistor DTR and the first and second switching transistors STR1 and STR2 may be formed as thin film transistors. While it has been mainly described in FIG. 4 that the driving transistor DTR and the first and second switching transistors STR1 and STR2 are N-type metal oxide semiconductor field effect transistors (MOSFETs), the present disclosure is not limited thereto. For example, the driving transistor DTR and the first and second switching transistors STR1 and STR2 may be P-type MOSFETs, or some of the driving transistor DTR and the first and second switching transistors STR1 and STR2 may be N-type MOSFETs and the others of the driving transistor DTR and the first and second switching transistors STR1 and STR2 may be P-type MOSFETs.

Hereinafter, the display device 10 including the display substrate DPS and the color changing substrate CCS will be described in more detail with reference to other drawings.

Figure 5:
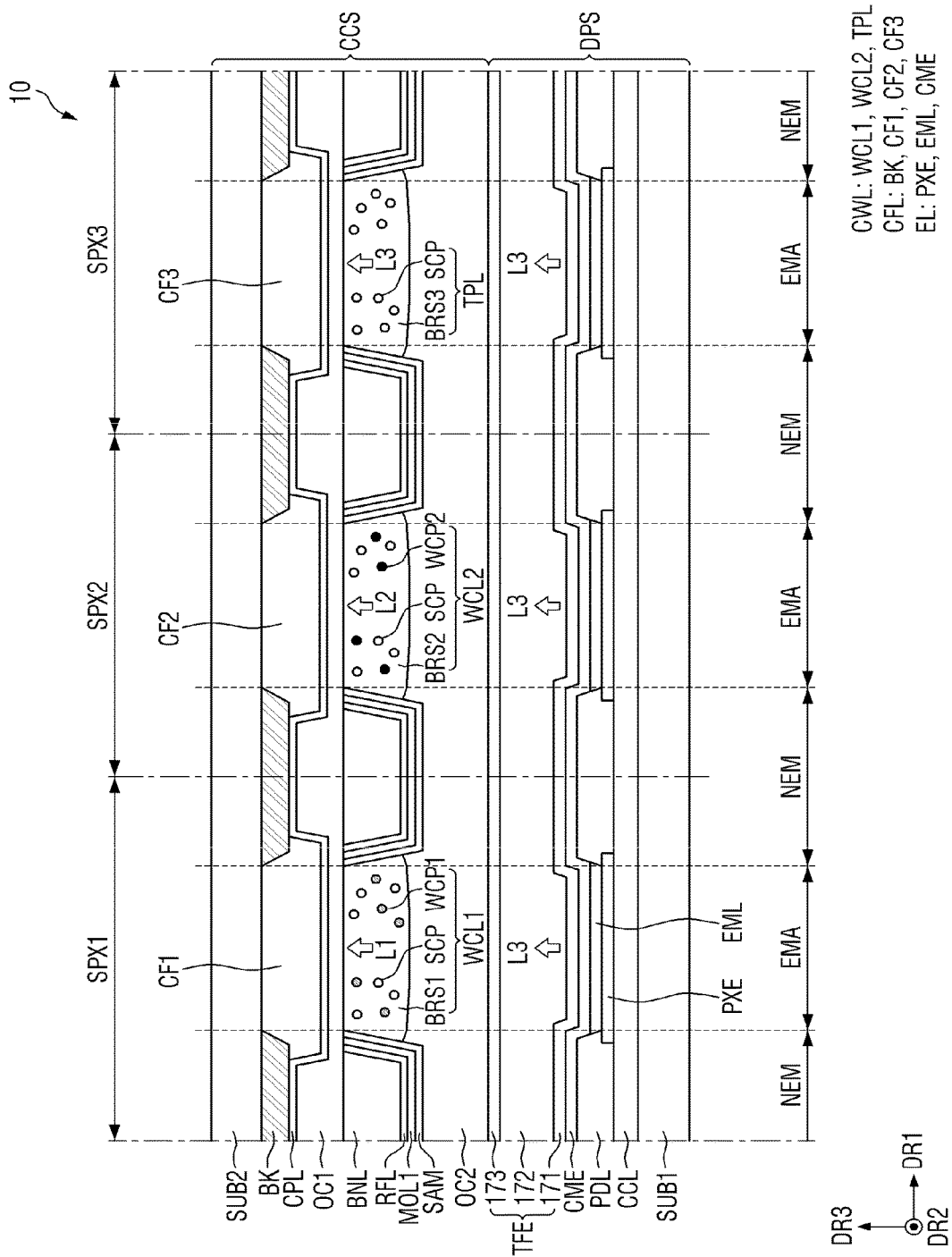
FIG. 5 is a schematic cross-sectional view illustrating the display device according to one or more embodiments.
Figure 6:
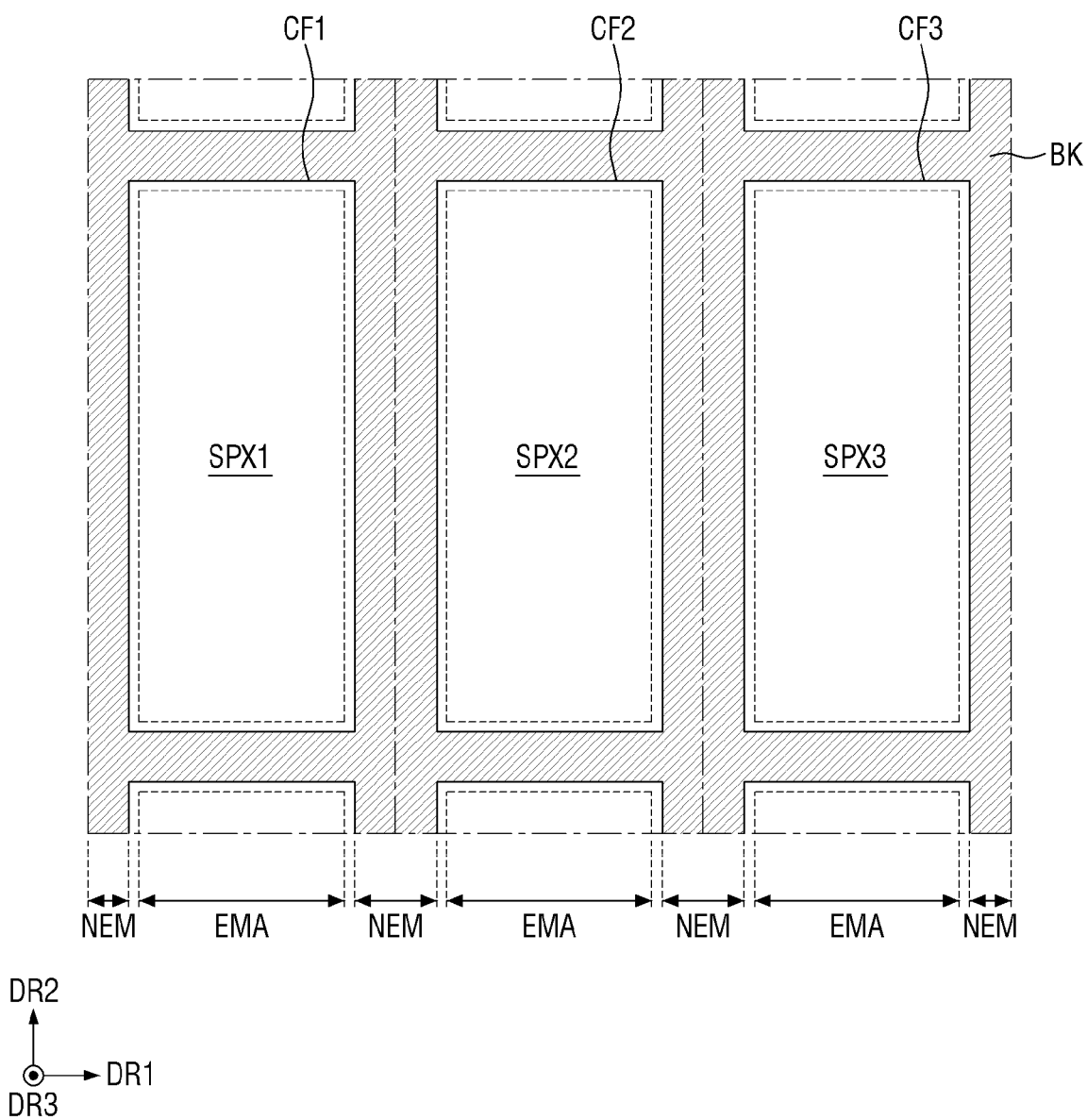
FIG. 6 is a schematic plan view illustrating a plurality of sub-pixels of a color changing substrate of the display device.
Figure 7:
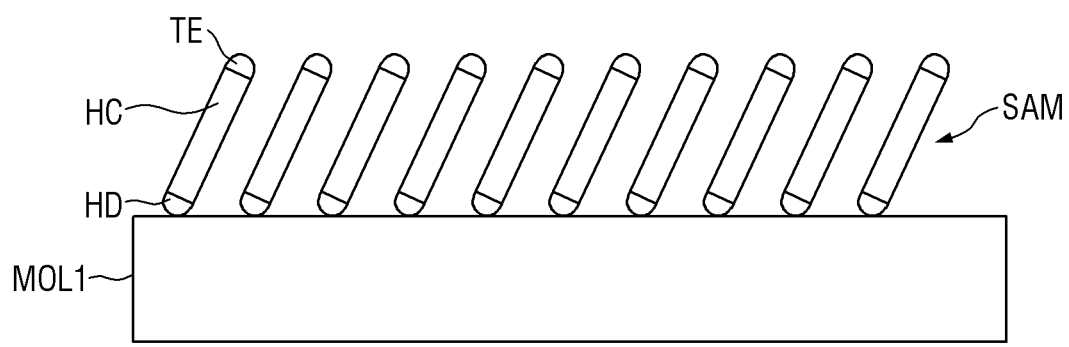
FIG. 7 is a schematic cross-sectional view illustrating a first metal oxide layer and a self-assembled layer.
Figure 8:
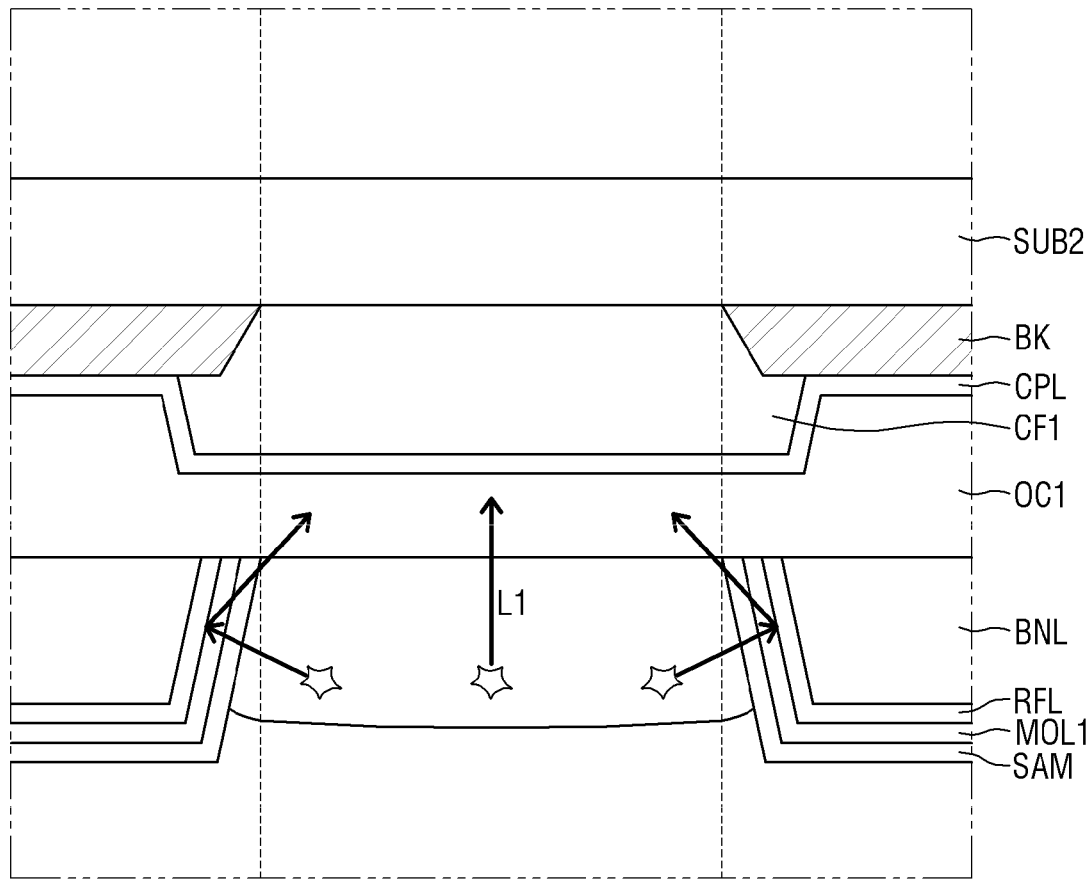
FIG. 8 is a schematic cross-sectional view illustrating that light is reflected by a reflective layer.

FIG. 5 is a schematic cross-sectional view illustrating the display device according to one or more embodiments. FIG. 6 is a schematic plan view illustrating a plurality of sub-pixels of a color changing substrate of the display device. FIG. 7 is a schematic cross-sectional view illustrating a first metal oxide layer and a self-assembled layer. FIG. 8 is a schematic cross-sectional view illustrating that light is reflected by a reflective layer. FIGS. 5 and 6 schematically illustrate three sub-pixels of the display device.

In FIG. 5, a top emission display device is illustrated, in which light L is emitted in a direction (e.g., the third direction DR3) toward the second substrate SUB2, which is a direction away from the first substrate SUB1 on which an emission layer EML is formed. However, the present disclosure is not limited thereto, and the display device may be a bottom emission display device in which light is emitted in the direction toward the first substrate SUB1 on which the emission layer EML is formed, or a double-sided emission display device in which light is emitted in both the direction toward the first substrate SUB1 and the direction toward the second substrate SUB2.

Referring to FIG. 5, the display device 10 may include the display substrate DPS and the color changing substrate CCS on the display substrate DPS.

The display substrate DPS may include the first substrate SUB1, the circuit layer CCL on the first substrate SUB1, and the light emitting element layer EL on the circuit layer CCL.

The first substrate SUB1 may be an insulating substrate. The first substrate SUB1 may include a transparent material. For example, the first substrate SUB1 may include a transparent insulating material such as glass and/or quartz. The first substrate SUB1 may be a rigid substrate. However, the first substrate SUB1 is not limited thereto, and may include plastic such as polyimide, and may have flexible characteristics to be bent, folded, and/or rolled.

The circuit layer CCL may be on the first substrate SUB1. The circuit layer CCL may drive the light emitting element layer EL and may be between the first substrate SUB1 and the light emitting element layer EL. The circuit layer CCL has been described above, and a redundant description thereof will not be provided.

The light emitting element layer EL may be on the circuit layer CCL. The light emitting element layer EL may include pixel electrodes PXE, a pixel defining layer PDL, emission layers EML, and a common electrode CME.

The pixel electrode PXE may be in each of the sub-pixels SPX1, SPX2, and SPX3. The pixel electrodes PXE have an island shape, and may be separated from each other in each of adjacent sub-pixels SPX1, SPX2, and SPX3. The pixel electrode PXE may be electrically connected to a transistor of the circuit layer CCL to receive a driving signal.

The pixel electrode PXE may be a first electrode, for example, an anode electrode, of an organic light emitting diode. The pixel electrode PXE may have a stacked film structure in which a material layer having a high work function, such as indium tin oxide (ITO), indium zinc oxide (IZO), zinc oxide (ZnO), and/or indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof, are stacked. The material layer having the high work function may be provided on a layer above the reflective material layer to be close to the emission layer EML. The pixel electrode PXE may have a multilayer structure of ITO/Mg, ITO/MgF, ITO/Ag, and/or ITO/Ag/ITO, but is not limited thereto.

The pixel defining layer PDL may be provided at boundaries between the respective sub-pixels SPX1, SPX2, and SPX3 on the first substrate SUB1. The pixel defining layer PDL may be positioned in a lattice pattern by including portions extending in the first direction DR1 and the second direction DR2 in plan view, and may be across the boundaries between the respective sub-pixels SPX1, SPX2, and SPX3 to divide the neighboring sub-pixels SPX1, SPX2, and SPX3. The pixel defining layer PDL may be provided on the pixel electrodes PXE and may include openings exposing the pixel electrodes PXE. Emission areas EMA and non-emission areas NEM may be partitioned and defined by the openings of the pixel defining layer PDL.

The pixel defining layer PDL may include an organic insulating material such as a polyacrylate resin, an epoxy resin, a phenolic resin, a polyamide resin, a polyimide resin, an unsaturated polyester resin, a polyphenyleneether resin, a polyphenylenesulfide resin, and/or benzocyclobutene (BCB). The pixel defining layer PDL may also include an inorganic material.

The emission layer EML may be on the pixel electrode PXE exposed by the pixel defining layer PDL. In one or more embodiments in which the display device 10 is an organic light emitting display device, the emission layer EML may include an organic layer including an organic material. The organic layer may include an organic light emitting layer, and may further include at least one of a hole injection layer, a hole transport layer, an electron transport layer, or an electron injection layer as an auxiliary layer assisting light emission in some cases. In other embodiments, when the display device 10 is an inorganic light emitting display device such as a micro LED display device and/or a nano LED display device, the emission layer EML may include an inorganic material such as an inorganic semiconductor.

In some embodiments, the emission layer EML may have a tandem structure including a plurality of organic light emitting layers overlapping each other in the thickness direction, and a charge generating layer between the adjacent organic light emitting layers. The respective organic light emitting layers overlapping each other may emit light of the same wavelength or may emit light of different wavelengths. At least some of the emission layers EML of the respective sub-pixels SPX1, SPX2, and SPX3 may be separated from the same layer of the neighboring sub-pixels SPX1, SPX2, and SPX3.

In one or more embodiments, wavelengths of light emitted by each of the emission layers EML may be the same for each of the sub-pixels SPX1, SPX2, and SPX3. For example, the emission layers EML of the respective sub-pixels SPX1, SPX2, and SPX3 may emit blue light or an ultraviolet ray, and a color changing substrate CCS to be described herein below may include a wavelength control layer CWL to display colors for each of the sub-pixels SPX1, SPX2, and SPX3.

In one or more embodiments, wavelengths of light emitted by each of the emission layers EML may be different for each of the sub-pixels SPX1, SPX2, and SPX3. For example, the emission layer EML of a first sub-pixel SPX1 may emit light of a first color, the emission layer EML of a second sub-pixel SPX2 may emit light of a second color, and the emission layer EML of a third sub-pixel SPX3 may emit light of a third color.

The common electrode CME may be provided on the emission layers EML. The common electrode CME may be not only in contact with the emission layers EML but also in contact with an upper surface of the pixel defining layer PDL. The common electrode CME may be connected without distinction of each of the sub-pixels SPX1, SPX2, and SPX3. For example, the common electrode CME may be an integral electrode entirely without distinction of the sub-pixels SPX1, SPX2, and SPX3. The common electrode CME may be a second electrode, for example, a cathode electrode, of the organic light emitting diode.

The common electrode CME may include a material layer having a small work function, such as Li, Ca, LiF/Ca, LiF/Al, Al, Mg, Ag, Pt, Pd, Ni, Au, Nd, Ir, Cr, BaF, Ba, a compound thereof, or a mixture thereof (e.g., a mixture of Ag and Mg, etc.). The common electrode CME may further include a transparent metal oxide layer on the material layer having the small work function.

The pixel electrode PXE, the emission layer EML, and the common electrode CME may constitute a light emitting element (e.g., an organic light emitting element). Light emitted from the emission layer EML may be emitted in an upward direction (e.g., the third direction DR3) through the common electrode CME.

In one or more embodiments, the light emitting element layer EL may further include a thin film encapsulation structure TFE on the common electrode CME. The thin film encapsulation structure TFE may include at least one thin film encapsulation layer. For example, the thin film encapsulation layer may include a first inorganic film 171, an organic film 172, and a second inorganic film 173. Each of the first inorganic film 171 and the second inorganic film 173 may include silicon nitride ($SiN_x$), silicon oxide ($SiO_x$), silicon oxynitride ($SiO_xN_y$), and/or the like. The organic film 172 may include an organic insulating material such as a polyacrylate resin, an epoxy resin, a phenolic resin, a polyamide resin, a polyimide resin, an unsaturated polyester resin, a polyphenyleneether resin, a polyphenylenesulfide resin, and/or benzocyclobutene (BCB).

The color changing substrate CCS may be provided on the display substrate DPS. The color changing substrate CCS may include the second substrate SUB2, the color filter layer CFL beneath the second substrate SUB2, and the wavelength control layer CWL beneath the color filter layer CFL.

Referring to FIGS. 5 and 6, the second substrate SUB2 may be an insulating substrate. The second substrate SUB2 may include a transparent material. For example, the second substrate SUB2 may include a transparent insulating material such as glass and/or quartz. The second substrate SUB2 may be a rigid substrate. However, the second substrate SUB2 is not limited thereto, and may include plastic such as polyimide, and may have flexible characteristics to be bent, folded, and/or rolled.

The color filter layer CFL may be beneath the second substrate SUB2. The color filter layer CFL may include a light blocking member BK on one surface of the second substrate SUB2 and a plurality of color filters CF1, CF2, and CF3 positioned in spaces partitioned by the light blocking member BK.

The light blocking member BK may be beneath the second substrate SUB2. The light blocking member BK may be in the non-emission areas NEA along the boundaries between the first to third sub-pixels SPX1, SPX2, and SPX3 beneath the second substrate SUB2. The light blocking member BK may overlap the pixel defining layer PDL in the thickness direction (e.g., the third direction DR3) of the display device 10.

The light blocking member BK may serve to not only block or reduce light emission, but also suppress or reduce external light reflection. The light blocking member BK may be formed in a lattice shape surrounding the emission areas EMA in plan view. The light blocking member BK may not be in the emission area EMA of each of the sub-pixels SPX1, SPX2, and SPX3, but may be in the non-emission area NEM. For example, the light blocking member BK may surround the emission areas EMA. In some embodiments, the light blocking member BK may be formed to have a width smaller than that of the pixel defining layer PDL. However, the present disclosure is not limited thereto, and the light blocking member BK may be formed to have substantially the same width as the pixel defining layer PDL.

The light blocking member BK may include an organic material. In one or more embodiments, the light blocking member BK may include a light absorbing material capable of absorbing a visible ray wavelength band. Because the light blocking member BK includes the light absorbing material and is provided along the boundaries between the first to third sub-pixels SPX1, SPX2, and SPX3, the light blocking member BK may define the emission areas EMA.

The plurality of color filters CF1, CF2, and CF3 may be positioned between the light blocking members BK and on the light blocking members BK. The plurality of color filters CF1, CF2, and CF3 may include a first color filter CF1, a second color filter CF2, and a third color filter CF3.

The first color filter CF1 may be in the emission area EMA of the first sub-pixel SPX1, the second color filter CF2 may be in the emission area EMA of the second sub-pixel SPX2, and the third color filter CF3 may be in the emission area EMA of the third sub-pixel SPX3. The first to third color filters CF1, CF2, and CF3 may be surrounded by the light blocking member BK.

The first to third color filters CF1, CF2, and CF3 may include colorants such as dyes or pigments capable of absorbing wavelengths other than corresponding color wavelengths. The first color filter CF1 may selectively transmit the light of the first color (e.g., red light) and block, absorb, or reduce the light of the second color (e.g., green light) and the light of the third color (e.g., blue light). The second color filter CF2 may selectively transmit the light of the second color (e.g., the green light) and block, absorb, or reduce the light of the first color (e.g., the red light) and the light of the third color (e.g., the blue light). The third color filter CF3 may selectively transmit the light of the third color (e.g., the blue light) and block, absorb, or reduce the light of the first color (e.g., the red light) and the light of the second color (e.g., the green light). For example, the first color filter CF1 may be a red color filter, the second color filter CF2 may be a green color filter, and the third color filter CF3 may be a blue color filter.

The first to third color filters CF1, CF2, and CF3 may absorb a portion of light introduced from the outside of the display device 10 to reduce reflected light due to external light. Therefore, the first to third color filters CF1, CF2, and CF3 may prevent or reduce distortion of colors due to external light reflection.

In some embodiments, areas of the openings of the light blocking member BK may be different for each of the sub-pixels SPX1, SPX2, and SPX3. The openings of the light blocking member BK may have different areas for each of the sub-pixels SPX1, SPX2, and SPX3 depending on the colorants included in the color filter layer CFL, and the pixel defining layer PDL is also positioned correspondingly, such that areas of each of the sub-pixels SPX1, SPX2, and SPX3 may be different from each other. For example, the first color filter CF1 including a red colorant may be in the first sub-pixel SPX1, and an area of the first sub-pixel SPX1 may be greater than those of the second and third sub-pixels SPX2 and SPX3. In addition, the second color filter CF2 including a green colorant may be in the second sub-pixel SPX2, and an area of the second sub-pixel SPX2 may be greater than that of the third sub-pixel SPX3. However, the present disclosure is not limited thereto. At least one of the plurality of sub-pixels SPX1, SPX2, and SPX3 may have an area different from that of the other sub-pixels SPX1, SPX2, and SPX3, and a magnitude relationship (e.g., size difference) between the areas of the plurality of sub-pixels SPX1, SPX2, and SPX3 may be different from that described above. In the display device 10, the respective sub-pixels SPX1, SPX2, and SPX3 are designed to have different areas, such that display quality degradation due to the external light reflection of the display device 10 may be prevented or reduced.

The plurality of color filters CF1, CF2, and CF3 may be provided in the emission areas EMA in each of the sub-pixels SPX1, SPX2, and SPX3. It has been illustrated in the drawings that the plurality of color filters CF1, CF2, and CF3 are positioned respectively in the sub-pixels SPX1, SPX2, and SPX3 to form an island-shaped pattern, but the present disclosure is not limited thereto. The plurality of color filters CF1, CF2, and CF3 may form a linear pattern over the entire display area DPA.

In one or more embodiments, a capping layer CPL may be beneath the color filter layer CFL. The capping layer CPL may be between the color filter layer CFL and the wavelength control layer CWL. In one or more embodiments, the capping layer CPL may cover the color filter layer CFL to prevent or reduce damage and/or contamination.

The capping layer CPL may include an inorganic material. For example, the capping layer CPL may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Meanwhile, it has been illustrated in the drawings that the capping layer CPL is formed as a single layer, but the present disclosure is not limited thereto. For example, the capping layer CPL may be formed as multiple layers in which inorganic layers including at least one of the materials exemplified as materials that may be included in the capping layer CPL are alternately stacked. The capping layer CPL may have a thickness in the range of about 0.05 µm to about 2 µm, but is not limited thereto.

The color changing substrate CCS may further include a first overcoat layer OC1 beneath the capping layer CPL. The first overcoat layer OC1 may be entirely in the first to third sub-pixels SPX1, SPX2, and SPX3 (e.g., may be a common layer among the first to third sub-pixels SPX1, SPX2, and SPX3), and a lower surface thereof may be flat. The first overcoat layer OC1 may planarize a step of the color filter layer CFL to facilitate manufacture of the wavelength control layer CWL in a subsequent process.

The first overcoat layer OC1 may be made of an organic material such as an acryl-based material and/or an epoxy-based material, but is not limited thereto.

The color changing substrate CCS may further include a bank BNL beneath the first overcoat layer OC1.

The bank BNL may be formed in a lattice pattern by including portions extending in the first direction DR1 and the second direction DR2 in plan view, and may be positioned across the boundaries between the respective sub-pixels SPX1, SPX2, and SPX3 to divide the neighboring sub-pixels SPX1, SPX2, and SPX3. In one or more embodiments, the bank BNL may surround the emission areas EMA and the non-emission areas NEM, and may partition the emission areas EMA and the non-emission areas NEM. The bank BNL may overlap the pixel defining layer PDL of the display substrate DPS, and may overlap the non-emission areas NEM.

The bank BNL may have a height (e.g., a set or predetermined height). For example, the bank BNL may have a height of about 1 µm to about 10 µm. The bank BNL may prevent or reduce the overflow of ink into adjacent sub-pixels SPX1, SPX2, and SPX3 in an inkjet printing process among the processes for manufacturing the wavelength control layer CWL of the display device 10. The bank BNL may prevent or reduce the mixing of different inks with each other for each of different sub-pixels SPX1, SPX2, and SPX3.

The bank BNL may include openings exposing the color filter layer CFL. The bank BNL may include a photosensitive organic material, but is not limited thereto.

The color changing substrate CCS of the display device 10 according to one or more embodiments may include a reflective layer RFL on the bank BNL, a first metal oxide layer MOL1 on the reflective layer RFL, and a self-assembled layer SAM on the metal oxide layer MOL1.

The reflective layer RFL may overlap the bank BNL. The reflective layer RFL may be on a lower surface and side surfaces of the bank BNL, and may be in contact with the lower surface and the side surfaces of the bank BNL. The reflective layer RFL may not overlap the emission areas EMA, and may overlap the non-emission areas NEM. The reflective layer RFL may overlap the pixel defining layer PDL of the display substrate DPS and the light blocking member BK of the color filter layer CFL.

The reflective layer RFL may serve to reflect light emitted from the wavelength control layer CWL. When the light emitted from the wavelength control layer CWL is incident on the bank BNL, the light may be partially absorbed by the bank BNL. In one or more embodiments, the reflective layer RFL is formed on the bank BNL to reflect the light, such that light extraction efficiency may be improved.

The reflective layer RFL may include a metal having high reflectivity. The metal may include silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof.

The reflective layer RFL may have a thickness (e.g., a set or predetermined thickness) to reflect the light. The reflective layer RFL may have a thickness in the range of, for example, about 10 nm to about 500 nm. However, the present disclosure is not limited thereto, and the reflective layer RFL may also be formed to have a thickness greater than that in the above range.

The first metal oxide layer MOL1 may be on the reflective layer RFL so as to overlap the reflective layer RFL. The first metal oxide layer MOL1 may be on a lower surface and side surfaces of the reflective layer RFL, and may be in contact with the lower surface and the side surfaces of the reflective layer RFL. The first metal oxide layer MOL1 may not overlap the emission areas EMA, and may overlap the non-emission areas NEM. The first metal oxide layer MOL1 may overlap the pixel defining layer PDL of the display substrate DPS and the light blocking member BK of the color filter layer CFL.

The first metal oxide layer MOL1 may serve to induce the self-assembled layer SAM to be selectively formed on the bank BNL. Because the self-assembled layer SAM is chemisorbed and formed on a surface of the first metal oxide layer MOL1, the first metal oxide layer MOL1 may induce the formation of the self-assembled layer SAM.

The first metal oxide layer MOL1 may include metal oxide. The metal oxide may include, for example, any one of indium tin oxide (ITO), indium zinc oxide (IZO), zinc oxide (ZnO), indium oxide ($In_2O_3$), and/or indium tin zinc oxide (ITZO).

The first metal oxide layer MOL1 may have a thickness (e.g., a set or predetermined thickness) to be uniformly (or substantially uniformly) formed on the reflective layer RFL. The first metal oxide layer MOL1 may have a thickness in the range of, for example, about 10 Å to about 500 Å. However, the present disclosure is not limited thereto, and the first metal oxide layer MOL1 may also be formed to have a thickness that is greater than that in the above range.

The self-assembled layer SAM may be on the first metal oxide layer MOL1 so as to overlap the first metal oxide layer MOL1. The self-assembled layer SAM may be on a lower surface and side surfaces of the first metal oxide layer MOL1, and may be in contact with a surface, for example, the lower surface and the side surfaces, of the first metal oxide layer MOL1. The self-assembled layer SAM may not overlap the emission areas EMA, and may overlap the non-emission areas NEM. The self-assembled layer SAM may be to overlap the pixel defining layer PDL of the display substrate DPS and the light blocking member BK of the color filter layer CFL.

The self-assembled layer SAM may serve to impart liquid repellency to an upper portion of the bank BNL to form the wavelength control layer CWL by an inkjet process. The self-assembled layer SAM may be a self-assembled monolayer (SAM) having a liquid repellent functional group at a terminal thereof. The self-assembled layer SAM is chemisorbed and formed on the surface of the first metal oxide layer MOL1, and may thus impart the liquid repellency to the bank BNL. Therefore, when the wavelength control layer CWL is formed by the inkjet process, it is possible to prevent or reduce the overflow and mixing of the ink with another ink in the adjacent sub-pixels SPX1, SPX2, and SPX3.

The self-assembled layer SAM is selectively chemisorbed on the surface of the first metal oxide layer MOL1, and may thus be in contact with the surface of the first metal oxide layer MOL1. It has been illustrated in the drawings that one end of the self-assembled layer SAM is in contact with the first overcoat layer OC1, but the self-assembled layer SAM may not be substantially in contact with the first overcoat layer OC1.

The self-assembled layer SAM may include a compound represented by the following Chemical Formula 1.

A-B-C     Chemical Formula 1

In Formula 1, "-" refers to a chemical bond. In addition, A may include one or more selected from the group consisting of a thiol group, a disulfide group, a carboxylic acid group, a phosphonic acid group, and a silane group. B may include one or more selected from the group consisting of a fluoroalkylene group, an alkylene group, an acylene group (e.g., a divalent acyl group), an amine group, a carboxylic acid group, a thiol group, and an ether group. C may include one or more selected from the group consisting of a fluoroalkyl group, an alkyl group, an acyl group, an amine group, a carboxylic acid group, a thiol group, and an alcohol group (e.g., a hydroxyl group). In addition, each of B and C may include one or more fluoro groups.

The compound represented by the above Chemical Formula 1 may be a compound as follows:

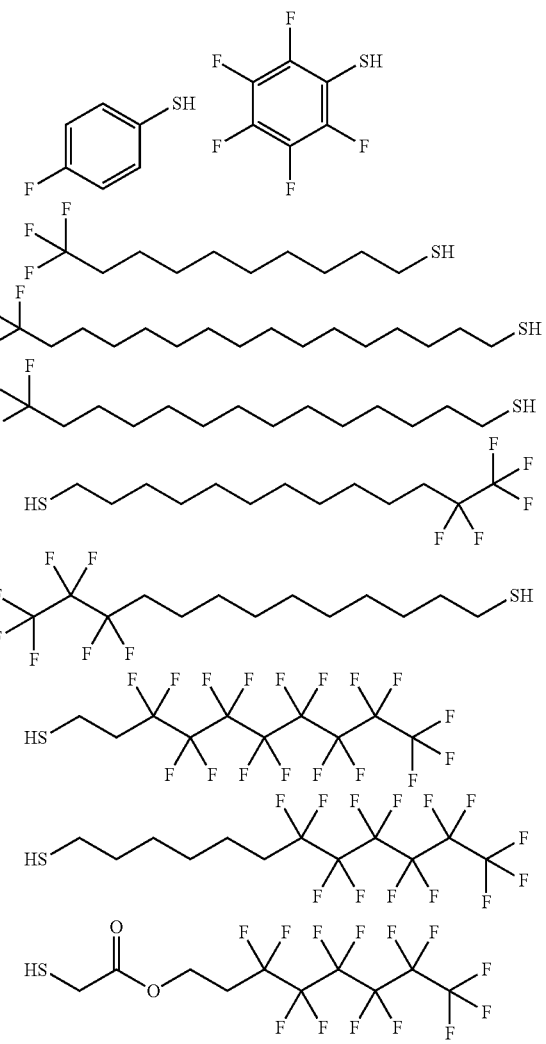

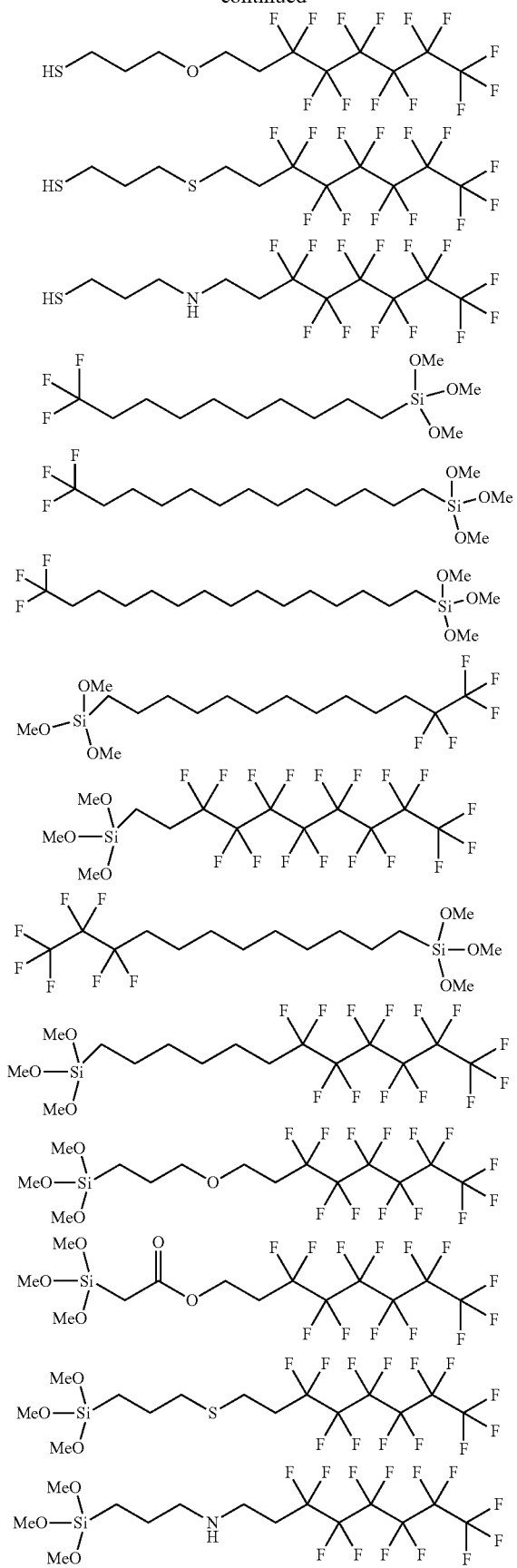
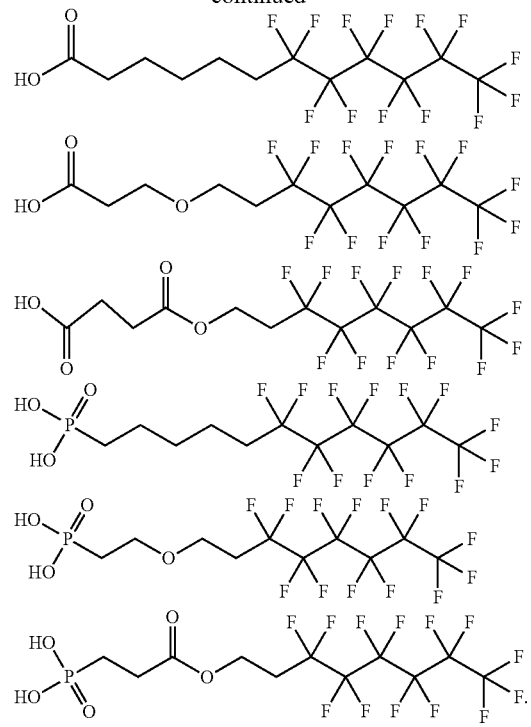

Referring to FIG. 7, the compound of the self-assembled layer SAM may be chemisorbed on the surface of the first metal oxide layer MOL1. The self-assembled layer SAM may include a compound including hydrocarbon chains HC, head portions HD at one (e.g., first) ends of the hydrocarbon chains HC, and terminal portions TE at the other (e.g., second) ends of the hydrocarbon chains HC. Here, in the compound of the self-assembled layer SAM, in Chemical Formula 1, A may form the head portion HD, B may form the hydrocarbon chain HC, and C may form the terminal portion TE. The head portions HD of the compound of the self-assembled layer SAM may be chemisorbed onto and in contact with the surface of the first metal oxide layer MOL1, and the terminal portions TE of the compound of the self-assembled layer SAM may be spaced apart from the first metal oxide layer MOL1 in a direction away from the first metal oxide layer MOL1. The terminal portions TE are portions having liquid repellent properties, and the terminal portions TE are on a surface of the self-assembled layer SAM, such that the surface of the first metal oxide layer MOL1 may have liquid repellency.

The self-assembled layer SAM described above may be formed by immersing the color changing substrate CCS on which the first metal oxide layer MOL1 is formed in a solution in which the compound represented by Chemical Formula 1 is dissolved. For example, the color changing substrate (CCS) on which the first metal oxide layer MOL1 is formed is immersed in a toluene solution in which a 10 mM poly(fluorene-alt-benzothiadiazole) (PFBT) compound is dissolved for 15 minutes. Thereafter, the color changing substrate CCS may be taken out, washed with a toluene solution, and dried in a nitrogen stream to manufacture the self-assembled layer SAM.

As described above, in one or more embodiments, the light extraction efficiency may be improved by forming the reflective layer RFL on the bank BNL to prevent or reduce the absorption of the light into the bank BNL. In addition, the color mixing may be prevented or reduced by forming the first metal oxide layer MOL1 and the self-assembled layer SAM on the bank BNL to prevent or reduce the overflow of the ink into the adjacent sub-pixels during the inkjet process for forming the wavelength control layer CWL.

In one or more embodiments, the wavelength control layer CWL may be in areas partitioned by the bank BNL. The wavelength control layer CWL may be between the color filter layer CFL and the display substrate DPS. The wavelength control layer CWL may be provided in areas surrounded by the bank BNL. The wavelength control layer CWL may be in each of the sub-pixels SPX1, SPX2, and SPX3, and may be in the emission areas EMA among the areas surrounded by the bank BNL.

In some embodiments, a height of the wavelength control layer CWL may be greater than the height of the bank BNL. The wavelength control layer CWL may be formed through an inkjet process among the processes for manufacturing the display device 10. The wavelength control layer CWL may be formed by jetting and applying a material constituting the wavelength control layer CWL in the areas surrounded by the bank BNL and then drying the material. As an example, the material constituting the wavelength control layer CWL may include an organic material to have viscosity, and even though the organic material is jetted or applied up to a position higher than the bank BNL, the organic material may not overflow into the other sub-pixels SPX1, SPX2, and SPX3 beyond the bank BNL. Accordingly, the height of the wavelength control layer CWL may be greater than that of the bank BNL. However, the present disclosure is not limited thereto.

In one or more embodiments in which the light emitting element layer EL of each of sub-pixels SPX1, SPX2, and SPX3 emits the light of the third color, which is the blue light, the wavelength control layer CWL may include a first wavelength conversion layer WCL1 in the first sub-pixel SPX1, a second wavelength conversion layer WCL2 in the second sub-pixel SPX2, and a light transmitting layer TPL in the third sub-pixel SPX3.

The first wavelength conversion layer WCL1 may include a first base resin BRS1 and first wavelength conversion materials WCP1 dispersed in the first base resin BRS1. The second wavelength conversion layer WCL2 may include a second base resin BRS2 and second wavelength conversion materials WCP2 dispersed in the second base resin BRS2. The first wavelength conversion layer WCL1 and the second wavelength conversion layer WCL2 convert a wavelength of the light of the third color incident from the light emitting element layer EL and transmit the light having the converted wavelength therethrough. Scatterers SCP of the first wavelength conversion layer WCL1 and the second wavelength conversion layer WCL2 may increase wavelength conversion efficiency.

The light transmitting layer TPL may include a third base resin BRS3 and scatterers SCP dispersed in the third base resin BSR3. The light transmitting layer TPL transmits the light of the third color incident from the light emitting element layer EL therethrough while maintaining the wavelength of the light of the third color. The scatterers SCP of the light transmitting layer TPL may serve to adjust an emission path of the light emitted through the light transmitting layer TPL. The light transmitting layer TPL may not include a wavelength conversion material.

The scatterers SCP may have a refractive index different from that of the first to third base resins BRS1, BRS2, and BRS3. The scatterers SCP may be metal oxide particles and/or organic particles. Examples of metal oxide of the metal oxide particles may include titanium oxide ($TiO_2$), zirconium oxide ($ZrO_2$), aluminum oxide ($Al_2O_3$), indium oxide ($In_2O_3$), zinc oxide ($ZnO_2$), silica, barium sulfate ($BaSO_4$), tin oxide ($SnO_2$), and the like, and examples of a material of the organic particles may include polystyrene, polymethyl methacrylate (PMMA), and the like. The scatterer SCP may have a hollow structure, but is not limited thereto.

A size of the scatterer SCP may be related to a wavelength of the light emitted from the light emitting element ED. For example, when the wavelength of the light emitted from the light emitting element ED is λ, the size of the scatterer SCP may be in the range of about λ/10 to about 5λ, and may be, for example, λ/2, but is not limited thereto. For example, when the light emitted from the light emitting element ED has a peak wavelength in the range of about 480 nm or less, for example, about 445 nm to about 480 nm or less, the size of the scatterer SCP may be in the range of about 150 nm to about 300 nm.

The first to third base resins BRS1, BRS2, and BRS3 may include a light-transmitting organic material. For example, the first to third base resins BRS1, BRS2, and BRS3 may include an epoxy-based resin, an acrylic resin, a cardo-based resin, an imide-based resin, and/or the like. All of the first to third base resins BRS1, BRS2, and BRS3 may be made of the same material, but are not limited thereto.

The first wavelength conversion material WCP1 may be a material converting the light of the third color into the light of the first color, and the second wavelength conversion material WCP2 may be a material converting the light of the third color into the light of the second color. The first wavelength conversion material WCP1 and the second wavelength conversion material WCP2 may be quantum dots, quantum rods, phosphors, and/or the like.

For example, the first wavelength conversion material WCP1 may be a material converting the blue light into the red light. In addition, the second wavelength conversion material WCP2 may be a material converting the blue light into the green light. The first wavelength conversion material WCP1 and the second wavelength conversion material WCP2 may be quantum dots (QD), quantum rods, fluorescent materials, and/or phosphorescent materials. The quantum dot may include group IV nanocrystals, group II-VI compound nanocrystals, group III-V compound nanocrystals, group IV-VI compound nanocrystals, or combinations thereof.

The quantum dot may include a core and a shell surrounding the core. The core may include, for example, at least one selected from CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge, but is not limited thereto. The shell may include, for example, at least one selected from ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, InGaP, TIN, TIP, TlAs, TlSb, PbS, PbSe, and PbTe, but is not limited thereto.

The fluorescent material may be an inorganic fluorescent material, and in some embodiments, an inorganic phosphor such as garnets, silicates, sulfides, oxynitrides, nitrides, and/or aluminates may be used as the inorganic fluorescent material. The inorganic phosphor may include, for example, at least one selected from $Y_3Al_5O_{12}:Ce^{3+}$ (YAG:Ce), $Tb_3Al_5O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ D=F,Cl,S,N,Br, $Ba_2MgSi_2O_7$: $Eu^{2+}$, $Ba_2SiO_4:Eu^{2+}$, $Ca_3(Sc,Mg)_2Si_3O_{12}:Ce^{3+}$, (Ca,Sr)S:

$Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, $Ca$-$\alpha$-$SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2+}$, but is not limited thereto. However, the present disclosure is not limited thereto, and the fluorescent material may include an organic fluorescent material.

The light emitted from each light emitting element layer EL may be the same light L3 of the third color. The light emitted from the light emitting element layer EL may travel toward the wavelength control layer CWL. The light L3 emitted from the light emitting element ED in the first sub-pixel SPX1 is incident on the first wavelength conversion layer WCL1, the light L3 emitted from the light emitting element ED in the second sub-pixel SPX2 is incident on the second wavelength conversion layer WCL2, and the light L3 emitted from the light emitting element ED in the third sub-pixel SPX2 is incident on the light transmitting layer TPL. The light L3 incident on the first wavelength conversion layer WCL1 may be converted into the light L1 of the first color, and the light incident on the second wavelength conversion layer WCL2 may be converted into the light L2 of the second color. The light incident on the light transmitting layer TPL may be transmitted as the same light L3 of the third color without wavelength conversion. Even though the respective sub-pixels SPX1, SPX2, and SPX3 include the light emitting element layers EL emitting the light of the same color, the respective sub-pixels SPX1, SPX2, and SPX3 may display light of different colors according to a disposition of the wavelength control layer CWL above the light emitting element layer EL.

In one or more embodiments, a portion of the light converted by the wavelength control layer CWL may be directly emitted to the color filter layer CFL, and the other portions of the light may be reflected by the reflective layer RFL formed on the bank BNL and then emitted to the color filter layer CFL.

Referring to FIG. 8, a portion of the light L1 of the first color converted by the first wavelength conversion layer WCL1 may be directly emitted to the first color filter CF1. The other portions of the light L1 of the first color converted by the first wavelength conversion layer WCL1 may be emitted toward the bank BNL, but may be reflected by the reflective layer RFL formed on the bank BNL and then emitted to the first color filter CF1. In the present embodiments, the light extraction efficiency may be improved by forming the reflective layer RFL on the bank BNL to prevent or reduce the absorption of the light into the bank BNL.

In one or more embodiments, the color changing substrate CCS may further include a second overcoat layer OC2 beneath the wavelength control layer CWL. The second overcoat layer OC2 may be entirely in the first to third sub-pixels SPX1, SPX2, and SPX3 (e.g., may be a common layer among the first to third sub-pixels SPX1, SPX2, and SPX3), and a lower surface thereof may be flat. The second overcoat layer OC2 may planarize a step of the wavelength control layer CWL to facilitate bonding between the color changing substrate CCS and the display substrate DPS in a subsequent process.

The second overcoat layer OC2 may be made of an organic material such as an acryl-based material and/or an epoxy-based material, and may be, for example, an adhesive layer. However, the present disclosure is not limited thereto.

Hereinafter, other embodiments will be described. In the following embodiments, redundant descriptions for the same configurations as those of the embodiments described above will not be provided or will be simplified, and configurations different from those of the embodiments described above will be mainly described.

Figure 9:
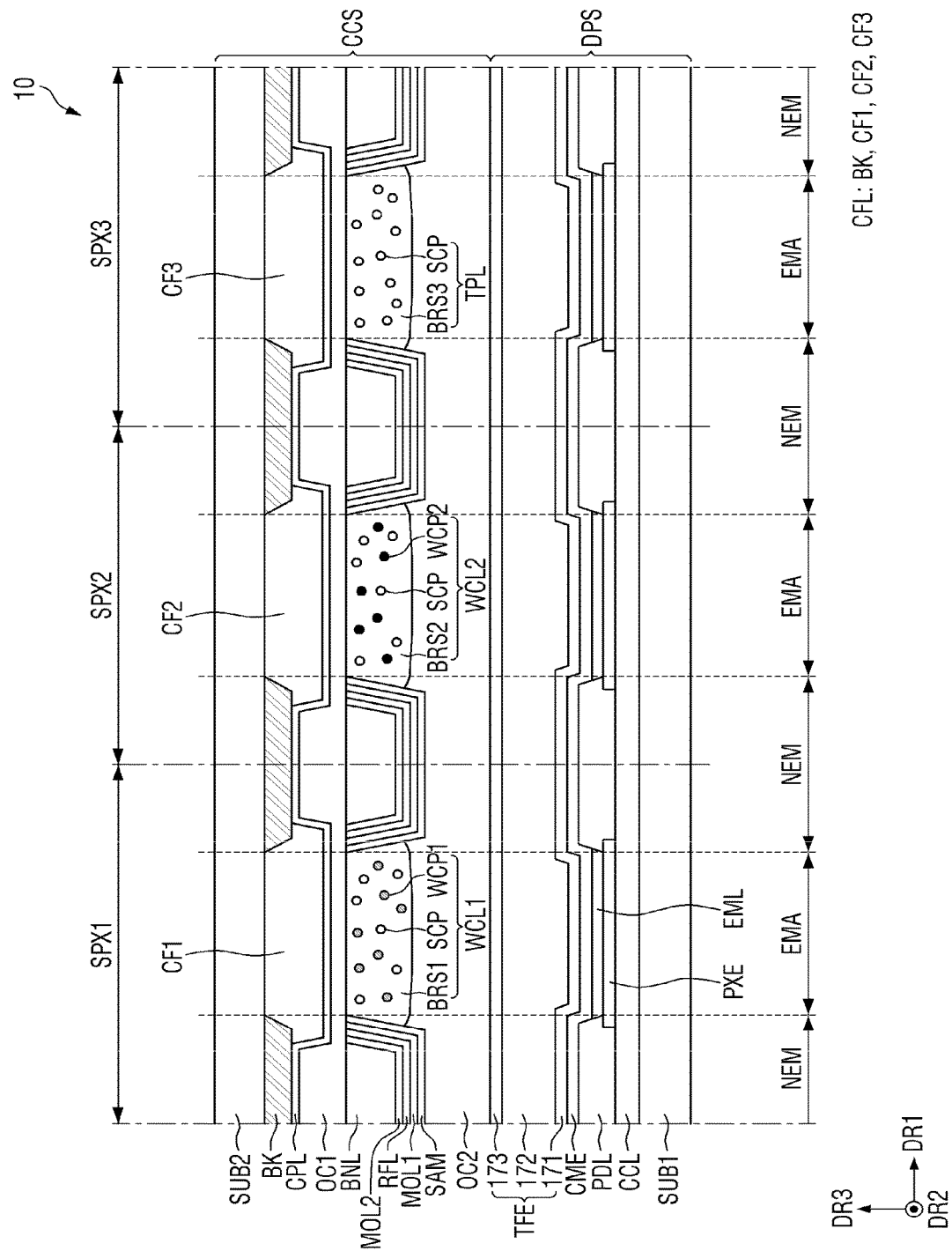
FIG. 9 is a schematic cross-sectional view illustrating a display device according to one or more other embodiments.

FIG. 9 is a schematic cross-sectional view illustrating a display device according to one or more other embodiments.

Referring to FIG. 9, a display device 10 according to the present embodiments is different from the display device 10 according to the embodiments described above with reference to FIG. 5 in that it further includes a second metal oxide layer MOL2 between the bank BNL and the reflective layer RFL.

For example, the second metal oxide layer MOL2 may be between the bank BNL and the reflective layer RFL. The second metal oxide layer MOL2 may be directly on the bank BNL. The second metal oxide layer MOL2 may be on a lower surface and side surfaces of the bank BNL, and may be in contact with the lower surface and the side surfaces of the bank BNL. In addition, the second metal oxide layer MOL2 may be directly on an upper surface of the reflective layer RFL, and may be in contact with the upper surface of the reflective layer RFL.

The second metal oxide layer MOL2 may not overlap the emission areas EMA, and may overlap the non-emission areas NEM. The second metal oxide layer MOL2 may overlap the pixel defining layer PDL of the display substrate DPS and the light blocking member BK of the color filter layer CFL.

The second metal oxide layer MOL2 is directly formed on the bank BNL to allow the reflective layer RFL to be formed on the second metal oxide layer MOL2. The reflective layer RFL made of a metal may have low adhesion properties to the bank BNL made of an organic material. In the present embodiments, adhesion properties between the reflective layer RFL and the second metal oxide layer MOL2 may be improved by forming the second metal oxide layer MOL2 having excellent adhesion properties to the bank BNL and forming the reflective layer RFL on the second metal oxide layer MOL2.

The second metal oxide layer MOL2 may include a metal oxide, and may include the same material as the first metal oxide layer MOL1 described above. The metal oxide may be selected from among, for example, indium tin oxide (ITO), indium zinc oxide (IZO), zinc oxide (ZnO), indium oxide ($In_2O_3$), and indium tin zinc oxide (ITZO).

The second metal oxide layer MOL2 may have a thickness in the range of about 10 Å to 500 about Å. However, the present disclosure is not limited thereto, and the second metal oxide layer MOL2 may also be formed to have a thickness greater than that in the above range.

Figure 10:
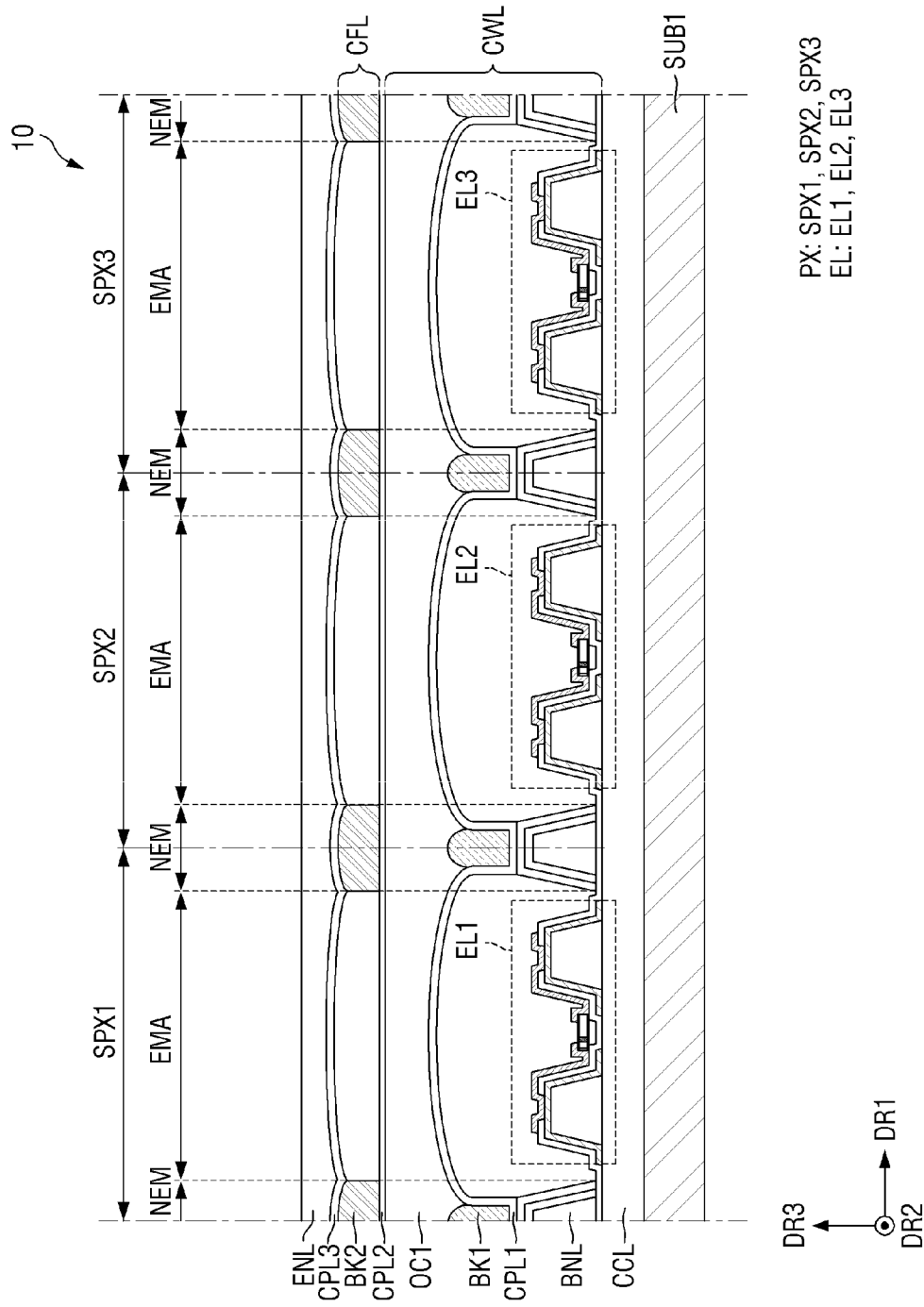
FIG. 10 is a schematic cross-sectional view illustrating a display device according to one or more other embodiments.

FIG. 10 is a schematic cross-sectional view illustrating a display device according to one or more other embodiments.

Referring to FIG. 10, a display device 10 according to the present embodiments is different from the display devices 10 according to the embodiments described above with reference to FIGS. 5 and 9 in that a light emitting element layer EL includes an inorganic light emitting diode.

Referring to FIG. 10, each of a plurality of pixels PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX1 may emit light of a third color. The first color may be red, the second color may be green, and the third color may be blue. Each of the sub-pixels SPX1, SPX2, and SPX3 may include an emission area EMA and a non-emission area NEM. The emission area EMA may be an area in which the light emitting element layer EL is to emit light in a set or corresponding wavelength band, and the non-emission area NEM may be an area in which the light emitting element layer EL is not provided, and the light is not emitted because the light does not reach the area.

The display device 10 may include a first substrate SUB1 and a light emitting element layer EL, a wavelength control layer CWL, and a color filter layer CFL on the substrate SUB1. In addition, the display device 10 may further include a circuit layer CCL between the first substrate SUB1 and the light emitting element layer EL, a bank BNL between the light emitting element layer EL and the wavelength control layer CWL, a first capping layer CPL1 between the wavelength control layer CWL and the color filter layer CFL, a first overcoat layer OC1 on the first capping layer CPL1, a second capping layer CPL2 on the first overcoat layer OC1, a third capping layer CPL3 on the color filter layer CFL, and an encapsulation layer ENL.

The bank BNL may be at boundaries between a plurality of sub-pixels SPX1, SPX2, and SPX3, and the light emitting element layer EL may be provided for each of the sub-pixels SPX1, SPX2, and SPX3 divided by the bank BNL. The light emitting element layer EL may be between the circuit layer CCL and the wavelength control layer CWL on the first substrate SUB1, and may include a plurality of light emitting elements to emit light in a set or corresponding wavelength band. The light may be incident on the color filter layer CFL through the wavelength control layer CWL.

The display device 10 according to the embodiments may be a top emission display device in which light is emitted in an upward direction of the first substrate SUB1 on which the light emitting element layer EL is positioned. The light emitted from the light emitting element layer EL may travel in a downward direction of the first substrate SUB1, but may be reflected by a structure in the light emitting element layer EL or a structure of the circuit layer CCL to be emitted in the upward direction of the first substrate SUB1. The display device 10 may be a top emission display device including only one substrate by including a plurality of layers sequentially positioned on the first substrate SUB1. Therefore, the display device 10 may be manufactured by sequentially stacking layers using only one substrate without performing a bonding process with another substrate, such that a manufacturing process may be improved.

Hereinafter, the display device 10 including the light emitting element layer EL, the bank BNL, the wavelength control layer CWL, and the color filter layer CFL will be described in more detail with reference to other drawings.

Figure 11:
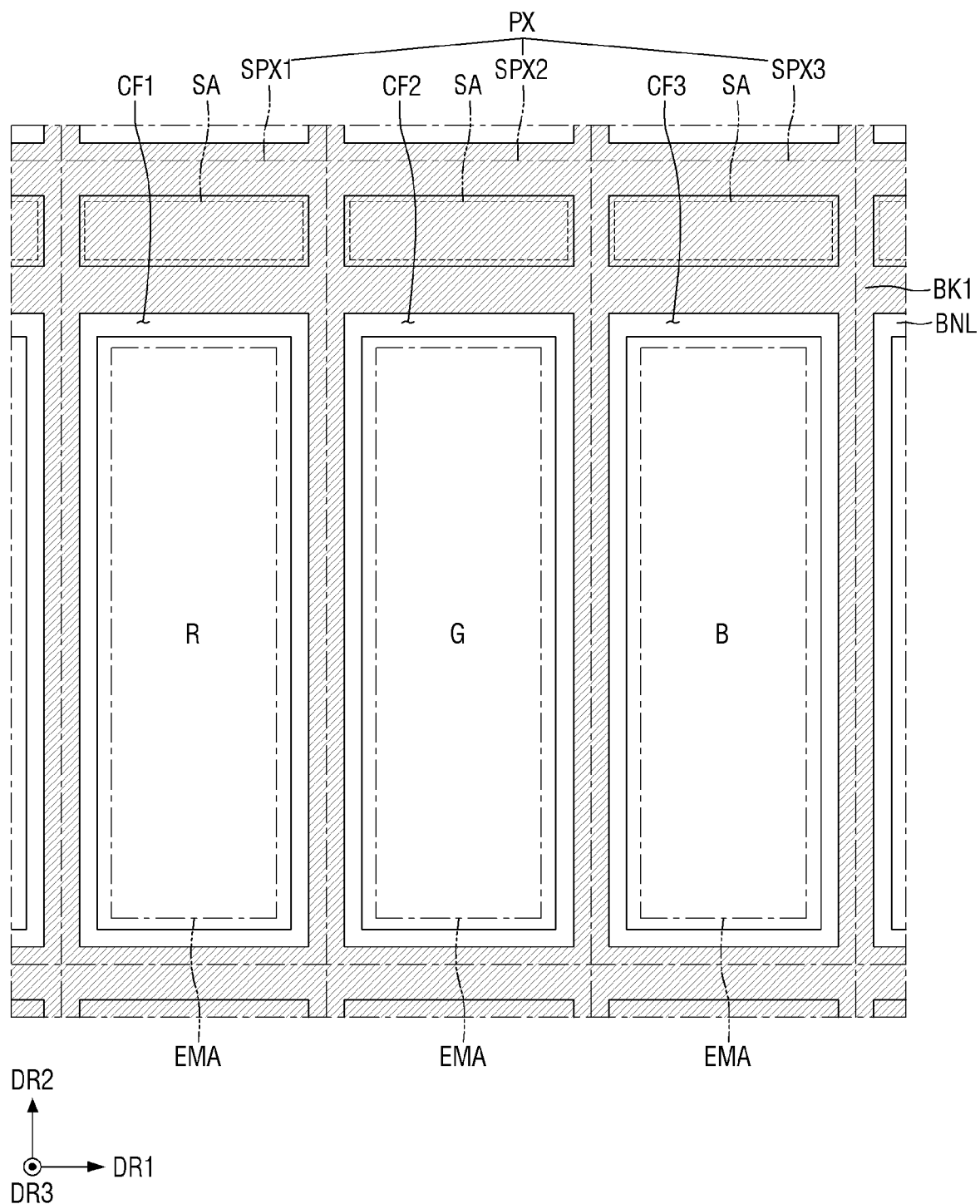
FIG. 11 is a schematic plan view illustrating a bank and a color filter layer in one pixel of the display device according to one or more embodiments.
Figure 12:
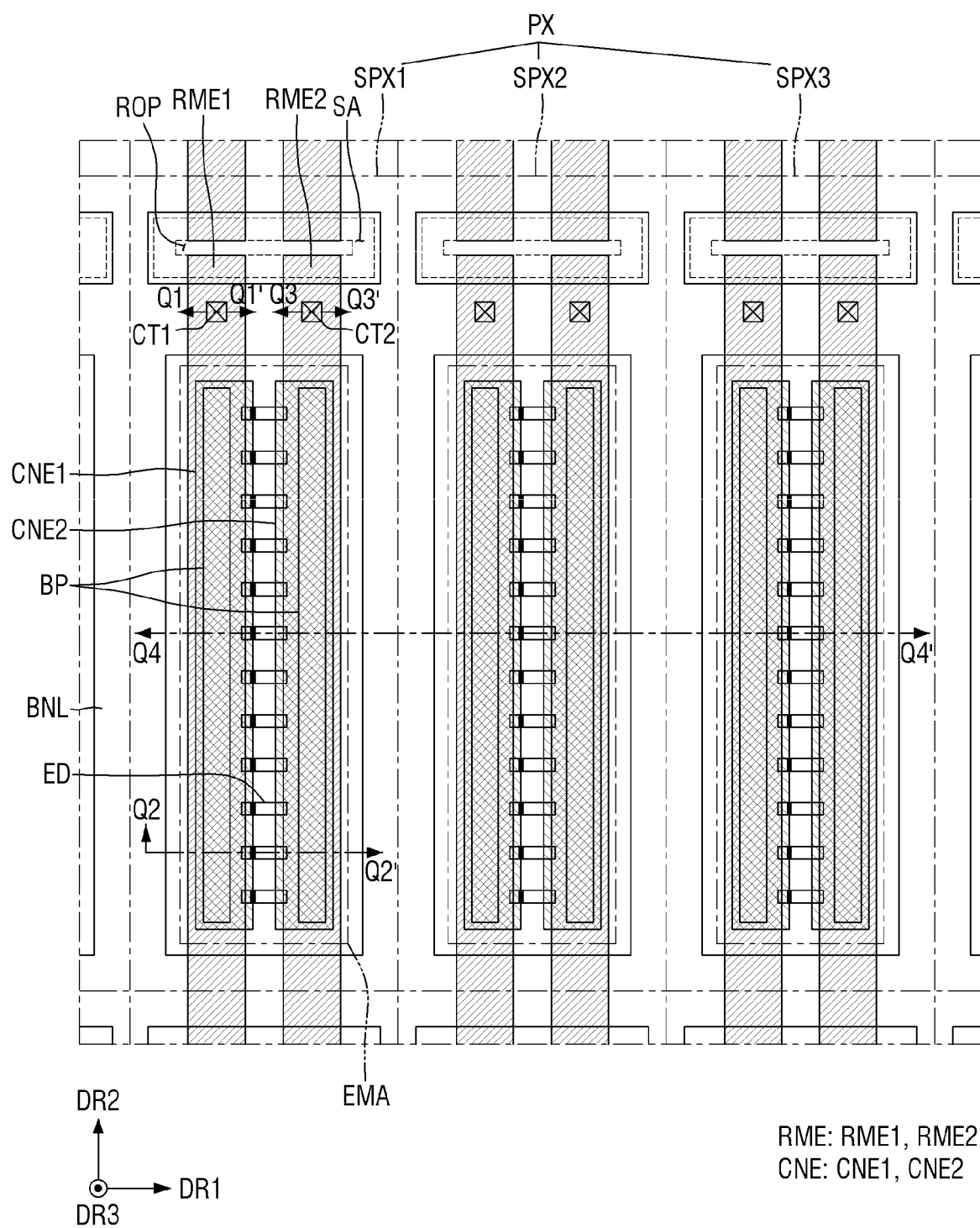
FIG. 12 is a schematic plan view illustrating a light emitting element layer in one pixel of the display device according to one or more embodiments.
Figure 13:
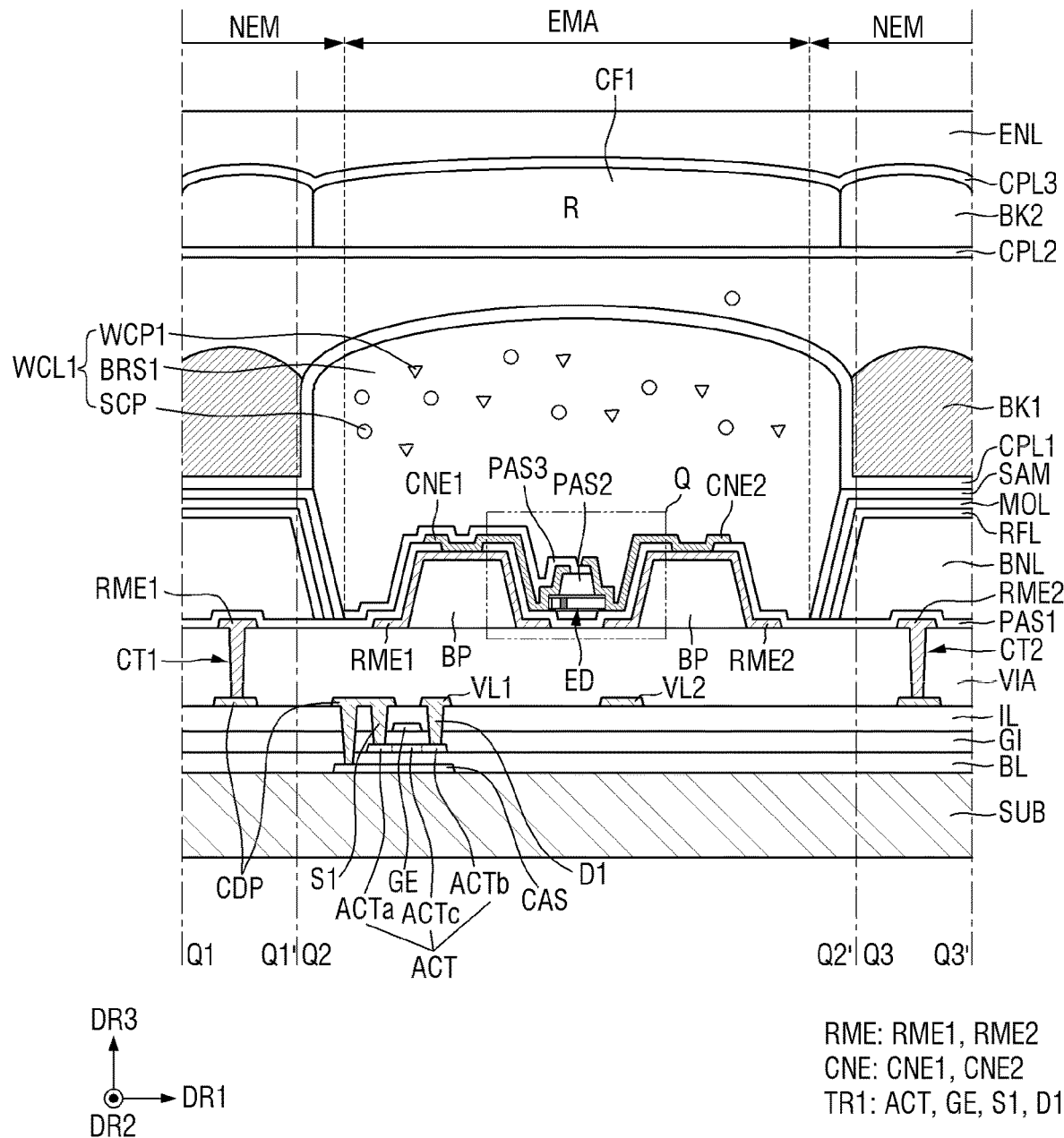
FIG. 13 is a cross-sectional view taken along the lines Q1-Q1', Q2-Q2', and Q3-Q3' of FIG. 12.
Figure 14:
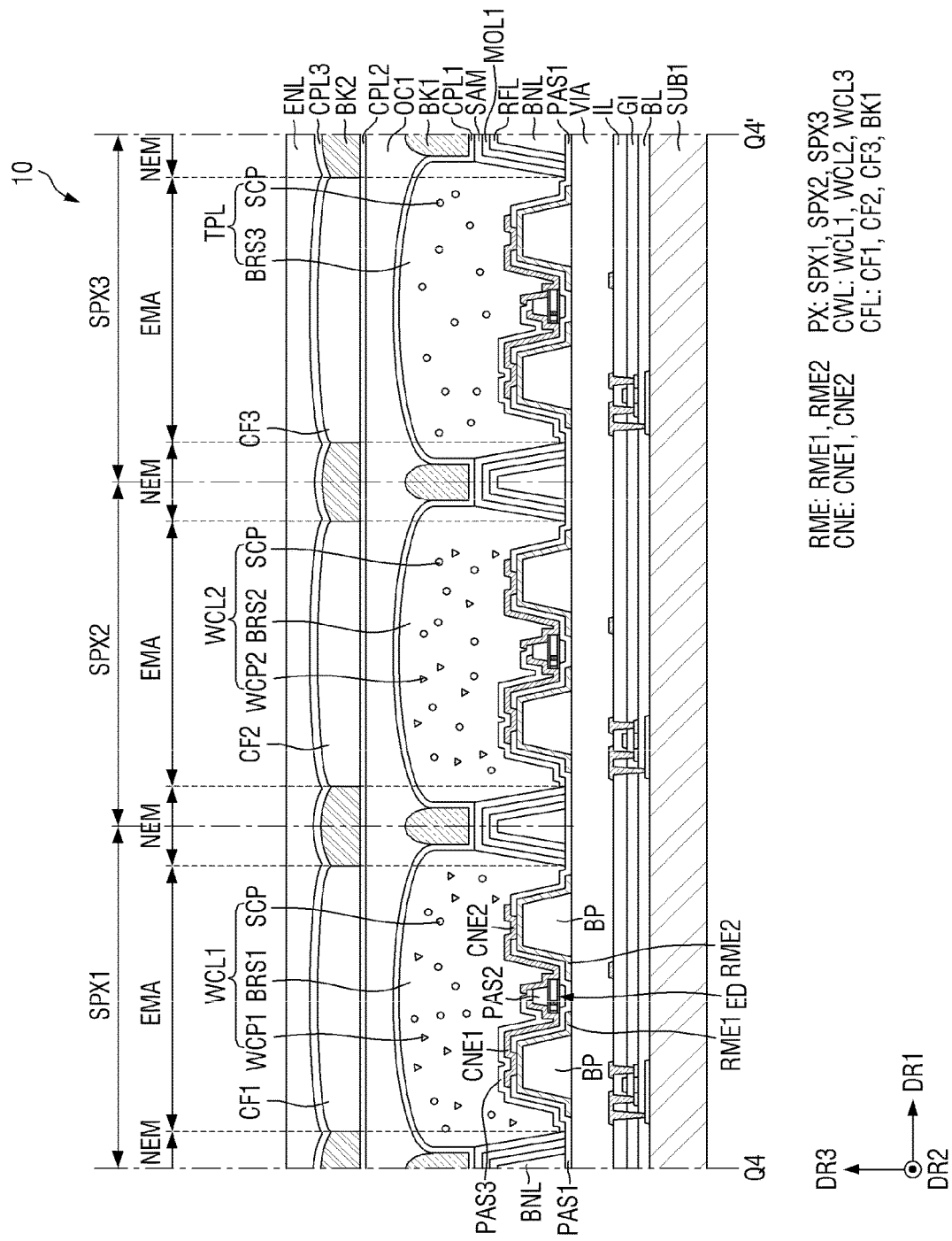
FIG. 14 is a cross-sectional view taken along the line Q4-Q4' of FIG. 12.
Figure 15:
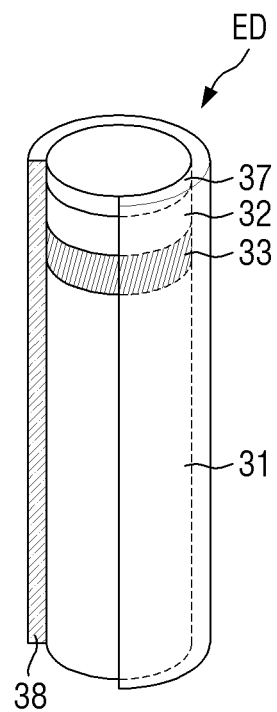
FIG. 15 is a schematic perspective view illustrating a light emitting element according to one or more embodiments.

FIG. 11 is a schematic plan view illustrating a bank and a color filter layer in one pixel of the display device according to one or more embodiments. FIG. 12 is a schematic plan view illustrating a light emitting element layer in one pixel of the display device according to one or more embodiments. FIG. 13 is a cross-sectional view taken along the lines Q1-Q1', Q2-Q2', and Q3-Q3' of FIG. 12. FIG. 14 is a cross-sectional view taken along the line Q4-Q4' of FIG. 12. FIG. 15 is a schematic perspective view illustrating a light emitting element according to one or more embodiments.

Referring to FIGS. 11 to 14 in conjunction with FIG. 10, the bank BNL is positioned across the boundaries between the respective sub-pixels SPX1, SPX2, and SPX3. The bank BNL may extend in the first direction DR1 and the second direction DR2, surround the sub-pixels SPX1, SPX2, and SPX3, and divide the neighboring sub-pixels SPX1, SPX2, and SPX3.

Each of the sub-pixels SPX1, SPX2, and SPX3 may include a non-emission area NEM, in addition to an emission area EMA. In addition, each of the sub-pixels SPX1, SPX2, and SPX3 may include a sub-area SA in the non-emission area NEM. The sub-area SA may be on one side of the emission area EMA in the second direction DR2. The sub-area SA may be between the emission areas EMA of the sub-pixels SPX1 neighboring in the second direction DR2, the sub-pixels SPX2 neighboring in the second direction DR2, and the sub-pixels SPX3 neighboring in the second direction DR2. A plurality of emission areas EMA and a plurality of sub-areas SA may be repeatedly arranged in the first direction DR1, respectively, but the emission areas EMA and the sub-areas SA may be alternately arranged with each other in the second direction DR2.

The bank BNL may be between the sub-areas SA and the emission area EMA, and an interval between the sub-areas SA and the emission areas EMA may vary depending on a width of the bank BNL in the second direction DR2. Light is not emitted in the sub-areas SA because the light emitting elements are not positioned in the sub-areas SA, but portions of electrodes RME1 and RME2 in each of the sub-pixels SPX1, SPX2, and SPX3 may be provided in the sub-areas SA. The electrodes RME1 and RME2 in each of the sub-pixels SPX1, SPX2, and SPX3 may be to be separated from each other in the sub-areas SA.

The first substrate SUB1 may be an insulating substrate. The circuit layer CCL may be on the first substrate SUB1. The circuit layer CCL may include a first conductive layer, a semiconductor layer, a second conductive layer, a third conductive layer, and a fourth conductive layer, and a plurality of insulating layers between the first conductive layer and the semiconductor layer, between the semiconductor layer and the second conductive layer, between the second conductive layer and the third conductive layer, and between the third conductive layer and the fourth conductive layer. It has been illustrated in the drawings that only one first transistor TR1 and some wirings are provided in the circuit layer CCL, but the present disclosure is not limited thereto. The circuit layer CCL of the display device 10 may include a larger number of transistors in addition to the first transistor TR1 by including more wirings, electrodes, and semiconductor layers. In one or more embodiments, the circuit layer CCL of the display device 10 may also include a capacitor. For example, the display device 10 may also include two, three, six, or seven transistors by including one or more transistors in addition to the first transistor TR1 for each of the sub-pixels SPX1, SPX2, and SPX3.

The first conductive layer CAS may be on the first substrate SUB1. The first conductive layer CAS may overlap an active layer ACT of the first transistor TR1 of the display device 10. The first conductive layer CAS may include a material blocking light to prevent or reduce the light incident on the active layer ACT of the first transistor. As an example, the first conductive layer CAS may be formed of an opaque metal material blocking or reducing transmission of the light. However, the present disclosure is not limited thereto, and in some cases, the first conductive layer CAS may be omitted.

A buffer layer BL may be entirely on the first conductive layer CAS and the first substrate SUB1. The buffer layer BL may be formed on the first substrate SUB1 to protect the first transistors TR1 of the pixels PX from moisture permeating through the first substrate SUB1 vulnerable to moisture permeation, and may perform a surface planarization function. The buffer layer BL may include a plurality of inorganic layers that are alternately stacked. For example, the buffer layer BL may be formed as a double layer in which inorganic layers including at least one selected from silicon oxide (SiO$_x$), silicon nitride (SiN$_x$), and silicon oxynitride (SiO$_x$N$_y$) are stacked, or as multiple layers in which these layers are alternately stacked. In one or more embodiments, each of the layers may be formed as one inorganic layer including the materials described above.

The semiconductor layer is on the buffer layer BL. The semiconductor layer may include the active layer ACT of the first transistor TR1. The semiconductor layer may partially overlap a gate electrode GE and/or the like of a second conductive layer to be described herein below.

In one or more embodiments, the semiconductor layer may include polycrystalline silicon, single crystal silicon, an oxide semiconductor, and/or the like. When the semiconductor layer includes the oxide semiconductor, each active layer ACT may include a plurality of conductive regions ACTa and ACTb and a channel region ACTc between the conductive regions ACTa and ACTb. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin Oxide (IZTO), indium gallium zinc oxide (IGZO), indium gallium tin oxide (IGTO), indium gallium zinc tin oxide (IGZTO), and/or the like.

In one or more embodiments, the semiconductor layer may include polycrystalline silicon. The polycrystalline silicon may be formed by crystallizing amorphous silicon. In this case, each of the conductive regions of the active layer ACT may be a doped region doped with impurities.

A gate insulating layer GI is on the semiconductor layer and the buffer layer BL. The gate insulating layer GI may function as a gate insulating film of each transistor. The gate insulating layer GI may be formed as a double layer in which inorganic layers including at least one selected from silicon oxide (SiO$_x$), silicon nitride (SiN$_x$), and silicon oxynitride (SiO$_x$N$_y$) are stacked, or multiple layers in which these layers are alternately stacked. In one or more embodiments, each of the layers may be formed as one inorganic layer including the materials described above.

The second conductive layer is on the gate insulating layer GI. The second conductive layer may include the gate electrode GE of the first transistor TR1. The gate electrode GE may overlap the channel region ACTc of the active layer ACT in the thickness direction. The second conductive layer may be formed as a single layer or multiple layers made of any one of molybdenum (Mo), aluminum (Al), chromium (Cr), gold (Au), titanium (Ti), nickel (Ni), neodymium (Nd), copper (Cu), or alloys thereof. However, the present disclosure is not limited thereto.

An interlayer insulating layer IL is on the second conductive layer. The interlayer insulating layer IL may cover the second conductive layer and serve to protect the second conductive layer. The interlayer insulating layer IL may be formed as a double layer in which inorganic layers including at least one selected from silicon oxide (SiO$_x$), silicon nitride (SiN$_x$), and silicon oxynitride (SiO$_x$N$_y$) are stacked, or multiple layers in which these layers are alternately stacked. In one or more embodiments, each of the layers may be formed as one inorganic layer including the materials described above.

The third conductive layer is on the interlayer insulating layer IL. The third conductive layer may include a source electrode S1 and a drain electrode D1 of the first transistor TR1, a first voltage line VL1, a second voltage line VL2, and a conductive pattern CDP.

The source electrode S1 and the drain electrode D1 of the first transistor TR1 may be in contact with the conductive regions ACTa and ACTb of the active layer ACT, respectively, through contact holes penetrating through the interlayer insulating layer IL and the gate insulating layer GI. In addition, the source electrode S1 of the first transistor TR1 may be electrically connected (e.g., electrically coupled) to the first conductive layer CAS through another contact hole.

A high potential voltage (or a first source voltage) transferred to a first electrode RME1 may be applied to the first voltage line VL1, and a low potential voltage (or a second source voltage) transferred to a second electrode RME2 may be applied to the second voltage line VL2. A portion of the first voltage line VL1 may be in contact with the active layer ACT of the first transistor TR1 through a contact hole penetrating through the interlayer insulating layer IL and the gate insulating layer GI. The first voltage line VL1 may serve as the drain electrode D1 of the first transistor TR1. The first voltage line VL1 may be directly connected to the first electrode RME1 to be described herein below. The second voltage line VL2 may be directly connected to the second electrode RME2 to be described herein below.

The conductive pattern CDP may be in contact with the active layer ACT of the first transistor TR1 through a contact hole penetrating through the interlayer insulating layer IL and the gate insulating layer GI. The conductive pattern CDP may serve as the source electrode S1 of the first transistor TR1.

The third conductive layer may be formed as a single layer or multiple layers made of any one of molybdenum (Mo), aluminum (Al), chromium (Cr), gold (Au), titanium (Ti), nickel (Ni), neodymium (Nd), copper (Cu), or alloys thereof. However, the present disclosure is not limited thereto.

A via layer VIA is on the third conductive layer. The via layer VIA may include an organic insulating material, for example, an organic material such as polyimide (PI), and may perform a surface planarization function.

A plurality of electrodes RME: RME1 and RME2, a plurality of bank patterns BP, a bank BNL, a plurality of light emitting elements ED, and a plurality of connection electrodes CNE1 and CNE2 may be provided as the light emitting element layer EL on the via layer VIA. In addition, a plurality of insulating layers PAS1, PAS2, and PAS3 may be on the via layer VIA.

The plurality of bank patterns BP may be directly on the via layer VIA. The plurality of bank patterns BP may have a shape in which they extend in the second direction DR2 within each of the sub-pixels SPX1, SPX2, and SPX3, but may not extend to the other sub-pixels SPX1, SPX2, and SPX3 neighboring in the second direction, and may be within the emission area EMA. In one or more embodiments, the plurality of bank patterns BP may be spaced apart from each other in the first direction DR1, and the light emitting element ED may be placed between the plurality of bank patterns BP. The plurality of bank patterns BP may be provided for each of the sub-pixels SPX1, SPX2, and SPX3 to form a linear pattern. Two bank patterns BP have been illustrated in the drawings, but the present disclosure is not limited thereto. A larger number of bank patterns BP may be provided, according to the number of electrodes RME1 and RME2.

The bank patterns BP may have a structure in which at least portions thereof protrude from an upper surface of the via layer VIA. The protruding portions of the bank patterns BP may have inclined side surfaces, and light emitted from the light emitting element ED may be reflected by the electrodes RME on the bank patterns BP and then emitted in an upward direction of the via layer VIA. The bank patterns BP may serve as reflective partition walls providing an area in which the light emitting element ED is positioned, and reflecting the light emitted from the light emitting element ED toward the upward direction. The side surfaces of the bank patterns BP may be inclined in a linear shape, but are not limited thereto, and the bank patterns BP may have a semi-circular shape or a semi-elliptical shape with a curved outer surface. The bank patterns BP may include an organic insulating material such as polyimide (PI), but are not limited thereto.

The plurality of electrodes RME may be on the bank pattern BP and the via layer VIA. The plurality of electrodes RME may include the first electrode RME1 and the second electrode RME2. The first electrode RME1 and the second electrode RME2 may extend in the second direction DR2 and to be spaced apart from each other in the first direction DR1.

The first electrode RME1 and the second electrode RME2 may extend in the second direction DR2 in the sub-pixels SPX1, SPX2 and SPX3, but may be separated from the other electrodes RME1 and RME2 in the sub-area SA. For example, the sub-area SA may be between the emission areas EMA of the sub-pixels SPX1 neighboring along the second direction DR2, the sub-pixels SPX2 neighboring along the second direction DR2, and the sub-pixels SPX3 neighboring along the second direction DR2, and the first electrode RME1 and the second electrode RME2 may be respectively separated from another first electrode RME1 and another second electrode RME2 in the respective sub-pixels SPX1, SPX2, and SPX3 neighboring along the second direction DR2 in a separation part ROP of the sub-area SA. However, the present disclosure is not limited thereto, and some electrodes RME1 and RME2 are not separated between the neighboring respective sub-pixels SPX1, SPX2, and SPX3, but may extend between the respective sub-pixels SPX1, SPX2, and SPX3 neighboring along the second direction DR2, or only one of the first electrode RME1 and the second electrode RME2 may be separated.

The first electrode RME1 may be electrically connected (e.g., electrically coupled) to the first transistor TR1 through a first electrode contact hole CT1, and the second electrode RME2 may be electrically connected (e.g., electrically coupled) to the second voltage line VL2 through a second electrode contact hole CT2. For example, the first electrode RME1 may be in contact with the conductive pattern CDP through the first electrode contact hole CT1 penetrating through the via layer VIA in an area overlapping the bank BNL, for example, between the sub-area SA and the emission area EMA. The second electrode RME2 may also be in contact with the second voltage line VL2 through the second electrode contact hole CT2 penetrating through the via layer VIA. However, the present disclosure is not limited thereto. In one or more embodiments, the first electrode contact hole CT1 and the second electrode contact hole CT2 may be in the sub-areas SA.

The first electrode contact hole CT1 connects the first electrode RME1 to the conductive pattern CDP, such that a signal for aligning the light emitting elements ED may be applied to the first voltage line VL1 and may be applied to the first electrode RME1 through the first transistor TR1 and the conductive pattern CDP. The second electrode contact hole CT2 connects the second electrode RME2 to the second voltage line VL2, such that the second source voltage may be applied to the second electrode RME2 through the second voltage line VL2. The first electrode RME1 and the second electrode RME2 are separated in the separation part ROP after alignment of the light emitting element ED as described herein below, such that the second electrode RME2 does not receive a signal from the second voltage line VL2.

It has been illustrated in the drawings that one first electrode RME1 and one second electrode RME2 are provided for each of the sub-pixels SPX1, SPX2, and SPX3, but the present disclosure is not limited thereto, and the number of first electrodes RME1 and second electrodes RME2 for each of the sub-pixels SPX1, SPX2, and SPX3 may be more than one. In one or more embodiments, the first electrode RME1 and the second electrode RME2 in each of the sub-pixels SPX1, SPX2, and SPX3 may not necessarily have a shape in which they extend in one direction, and the first electrode RME1 and the second electrode RME2 may have various suitable structures. For example, the first electrode RME1 and the second electrode RME2 may have a partially curved or bent shape, and any one of the first electrode RME1 and the second electrode RME2 may surround the other of the first electrode RME1 and the second electrode RME2.

The first electrode RME1 and the second electrode RME2 may be directly on the bank patterns BP, respectively. The first electrode RME1 and the second electrode RME2 may be formed to have a width greater than that of the bank patterns BP, respectively. For example, the first electrode RME1 and the second electrode RME2 may cover outer surfaces of the bank patterns BP, respectively. The first electrode RME1 and the second electrode RME2 may be on the side surfaces of the bank patterns BP, respectively, and an interval between the first electrode RME1 and the second electrode RME2 may be smaller than an interval between the bank patterns BP. At least partial areas of the first electrode RME1 and the second electrode RME2 may be directly on the via layer VIA, such that the first electrode RME1 and the second electrode RME2 may be on the same plane. However, the present disclosure is not limited thereto. In some embodiments, the first electrode RME1 and the second electrode RME2 may have a width smaller than that of the bank patterns BP. However, each of the first and second electrodes RME1 and RME2 may cover at least one side surface of the bank pattern BP to reflect the light emitted from the light emitting element ED.

The first electrode RME1 and the second electrode RME2 may include a conductive material having high reflectivity. For example, the first electrode RME1 and the second electrode RME2 may include a metal such as silver (Ag), copper (Cu), and/or aluminum (Al), or include an alloy including aluminum (Al), nickel (Ni), lanthanum (La), and/or the like, as the material having the high reflectivity. The first electrode RME1 and the second electrode RME2 may reflect the light emitted from the light emitting element ED and traveling to the side surfaces of the bank patterns BP toward an upward direction of each of the sub-pixels SPX1, SPX2, and SPX3.

However, the present disclosure is not limited thereto, and the first electrode RME1 and the second electrode RME2 may further include a transparent conductive material. For example, the first electrode RME1 and the second electrode RME2 may include a material such as indium tin oxide (ITO), indium zinc oxide (IZO), and/or indium tin zinc oxide (ITZO). In some embodiments, the first electrode RME1 and the second electrode RME2 may have a structure in which one or more layers made of the transparent conductive material, and one or more layers made of the metal having the high reflectivity, are stacked, or may be formed as one layer including the transparent conductive material and the metal having the high reflectivity. For example, the first electrode RME1 and the second electrode RME2 may have a stacked structure such as ITO/silver (Ag)/ITO, ITO/Ag/IZO, or ITO/Ag/ITZO/IZO.

The first and second electrodes RME1 and RME2 may also be utilized to form an electric field in each of the sub-pixels SPX1, SPX2, and SPX3 to align the light emitting element ED. The light emitting element ED may be positioned between the first electrode RME1 and the second electrode RME2 by an electric field formed on the first electrode RME1 and the second electrode RME2. Ink including the light emitting element ED of the display device 10 may be jetted onto the electrodes RME through an inkjet printing process. When the ink including the light emitting element ED is jetted onto the electrodes RME, an alignment signal is applied to the electrodes RME to generate an electric field. A voltage (e.g., a set or predetermined voltage) may be applied to the first electrode RME1 and the second electrode RME2 through the first voltage line VL1 and the second voltage line VL2 so that the light emitting elements ED may be aligned. The light emitting elements ED dispersed in the ink may be aligned by receiving a dielectrophoretic force by the electric field generated on the electrodes RME1 and RME2.

The electrodes RME1 and RME2 positioned in different sub-pixels SPX1, SPX2, and SPX3 neighboring along the second direction DR2 may be spaced apart from each other in the separation part ROP of the sub-area SA. Such a disposition of the electrodes RME1 and RME2 may be implemented by forming one electrode lines extending in the second direction DR2, locating the light emitting elements ED, and then separating the electrode lines in a subsequent process. The electrode lines may be utilized to generate an electric field in each of the sub-pixels SPX1, SPX2, and SPX3 to align the light emitting elements ED in the process of manufacturing the display device 10. The plurality of electrodes RME1 and RME2 spaced apart from each other in the second direction DR2 may be formed by separating the electrode lines in the separation part ROP after aligning the light emitting elements ED.

A first insulating layer PAS1 may be on the via layer VIA, the bank patterns BP, and the plurality of electrodes RME1 and RME2. The first insulating layer PAS1 may be on the via layer VIA so as to cover the plurality of electrodes RME1 and RME2 and the bank patterns BP. The first insulating layer PAS1 may also be in the sub-area SA, but may not be in the separation part ROP in which the electrodes RME1 and RME2 are spaced apart from each other. The first insulating layer PAS1 may protect the plurality of electrodes RME1 and RME2 and may insulate different electrodes RME1 and RME2 from each other. In some embodiments, the first insulating layer PAS1 may prevent or reduce the risk of direct contact of the light emitting element ED positioned on the first insulating layer PAS1 with other members, and damage to the light emitting element ED by other members.

In one or more embodiments, the first insulating layer PAS1 may have a step formed so that a portion of an upper surface thereof is recessed between the electrodes RME1 and RME2 spaced apart from each other in the first direction DR1. The light emitting element ED may be on the upper surface of the first insulating layer PAS1 in which the step (e.g., a recessed portion) is formed, and a space may be formed between the light emitting element ED and the first insulating layer PAS1.

The bank BNL may be on the first insulating layer PAS1. The bank BNL may be formed in a lattice pattern by including portions extending in the first direction DR1 and the second direction DR2 in plan view, and may be positioned across the boundaries between the respective sub-pixels SPX1, SPX2, and SPX3 to divide the neighboring sub-pixels SPX1, SPX2, and SPX3. In one or more embodiments, the bank BNL may surround the emission areas EMA and the sub-areas SA, and areas divided and opened by the bank BNL may be the emission areas EMA and the sub-areas SA, respectively.

The bank BNL may have a height (e.g., a set or predetermined height), and in some embodiments, a height of an upper surface of the bank BNL may be greater than that of the bank pattern BP, and a thickness of the bank BNL may be the same as or greater than the bank pattern BP. However, the present disclosure is not limited thereto, and the height of the upper surface of the bank BNL may be the same as or smaller than that of the bank pattern BP, and the thickness of the bank BNL may be smaller than that of the bank pattern BP. The bank BNL may prevent or reduce the overflow of ink into adjacent sub-pixels SPX1, SPX2, and SPX3 in the inkjet printing process among the processes for manufacturing the display device 10. The bank BNL may prevent or reduce the mixing of inks in which different light emitting elements ED are dispersed for each of different sub-pixels SPX1, SPX2, and SPX3 with each other. The bank BNL may include polyimide like the bank pattern BP, but is not limited thereto.

The plurality of light emitting elements ED may be on the first insulating layer PAS1. The light emitting element ED may include a plurality of layers in a direction parallel to an upper surface of the first substrate SUB1. The light emitting element ED of the display device 10 may be provided so that one direction in which the light emitting element ED extends is parallel to the first substrate SUB1, and a plurality of semiconductor layers included in the light emitting element ED may be sequentially provided along the direction parallel to the upper surface of the first substrate SUB1. However, the present disclosure is not limited thereto. In some embodiments, when the light emitting element ED has another structure, the plurality of layers may be positioned in the third direction DR3 crossing (e.g., perpendicular) to the first substrate SUB1.

The plurality of light emitting elements ED may be spaced apart from each other along the second direction DR2 in which the respective electrodes RME1 and RME2 extend, and may be aligned to be substantially parallel to each other. The light emitting element ED may have a shape in which it extends in one direction, and a direction in which the respective electrodes RME1 and RME2 extend and a direction in which the light emitting element ED extends may be substantially perpendicular to each other. However, the present disclosure is not limited thereto, and the light emitting element ED may not be perpendicular to the direction in which the respective electrodes RME1 and RME2 extend, and may also be oblique to (e.g., may extend in a direction oblique to) the direction in which the respective electrodes RME1 and RME2 extend.

The light emitting elements ED in the respective sub-pixels SPX1, SPX2, and SPX3 may include an emission layer to emit light in the same wavelength band to the outside. Accordingly, light of the same color may be emitted from the first sub-pixel SPX1, the second sub-pixel SPX2, and the third sub-pixel SPX3.

Both ends of the light emitting element ED may be on the electrodes RME1 and RME2 between the bank patterns BP. An extension length of the light emitting element ED may be greater than the interval between the first electrode RME1 and the second electrode RME2, and both ends of the light emitting element ED may be on the first electrode RME1 and the second electrode RME2, respectively. For example, the light emitting element ED may be positioned so that one end thereof is on the first electrode RME1 and the other end thereof is on the second electrode RME2.

Both ends of the light emitting element ED may be in contact with the connection electrodes CNE1 and CNE2, respectively. For example, an insulating film 38 (see e.g., FIG. 15) may not be formed on an end surface of the light emitting element ED in one direction in which the light emitting element ED extends, and semiconductor layers 31 and 32 (see e.g., FIG. 15) and/or an electrode layer 37 (see e.g., FIG. 15) may be partially exposed, and the exposed semiconductor layers and/or electrode layer may be in contact with the connection electrodes CNE1 and CNE2. However, the present disclosure is not limited thereto, and in the light emitting element ED, at least a partial area of the insulating film may be removed, such that both side surfaces of the semiconductor layers may be partially exposed. The exposed side surfaces of the semiconductor layers may also be in direct contact with the connection electrodes CNE1 and CNE2.

A second insulating layer PAS2 may be partially provided on the light emitting element ED. For example, the second insulating layer PAS2 may have a width smaller than the extension length of the light emitting element ED so that both ends of the light emitting element ED are exposed while surrounding the light emitting element ED, and may be on the light emitting element ED. The second insulating layer PAS2 may cover the light emitting element ED, the electrodes RME1 and RME2, and the first insulating layer PAS1 in the process of manufacturing the display device 10, and may be then patterned to expose both ends of the light emitting element ED. The second insulating layer PAS2 may extend in the second direction DR2 on the first insulating layer PAS1 and the light emitting element ED in plan view to form a linear or island-shaped pattern in each of the sub-pixels SPX1, SPX2, and SPX3. The second insulating layer PAS2 may protect the light emitting element ED and fix (e.g., affix) the light emitting element ED in the process of manufacturing the display device 10.

The plurality of connection electrodes CNE1 and CNE2 may be on the first insulating layer PAS1, the second insulating layer PAS2, and the light emitting element ED.

The plurality of connection electrodes CNE1 and CNE2 may be on the electrodes RME1 and RME2. The connection electrodes CNE1 and CNE2 may include a first connection electrode CNE1 on the first electrode RME1 and a second connection electrode CNE2 on the second electrode RME2. The respective connection electrodes CNE1 and CNE2 may be spaced apart from each other or may face each other. For example, the first connection electrode CNE1 and the second connection electrode CNE2 may be on the first electrode RME1 and the second electrode RME2, respectively, and may be spaced apart from each other in the first direction DR1.

The first connection electrode CNE1 may extend in the second direction DR2 within the emission area EMA. The first connection electrode CNE1 may overlap the first electrode RME1 and may be in parallel (or substantially in parallel) with the first electrode RME1. The first connection electrode CNE1 may have a shape by which it generally extends in the second direction DR2.

The second connection electrode CNE2 may extend in the second direction DR2 within the emission area EMA. The second connection electrode CNE2 may overlap the second electrode RME2 and may be in parallel (or substantially in parallel) with the second electrode RME2. The second connection electrode CNE2 may have a shape by which it generally extends in the second direction DR2.

Each of the plurality of connection electrodes CNE1 and CNE2 may be in contact with the light emitting element ED. The first connection electrode CNE1 may be in contact with one end of the light emitting elements ED, and the second connection electrode CNE2 may be in contact with the other end of the light emitting element ED. The semiconductor layer or the electrode layer may be exposed on both end surfaces of the light emitting element ED in the direction in which the light emitting element ED extends, and each of the connection electrodes CNE1 and CNE2 may be in contact with and electrically connected (e.g., electrically coupled) to the semiconductor layer or the electrode layer of the light emitting element ED. One side of each of the connection electrodes CNE1 and CNE2 in contact with the respective end of the light emitting element ED may be on side surfaces of the second insulating layer PAS2. In one or more embodiments, the first connection electrode CNE1 may be on one side surface of the second insulating layer PAS2, and the second connection electrode CNE2 may be on the other side surface of the second insulating layer PAS2.

A width of each of the connection electrodes CNE1 and CNE2 measured in one direction may be smaller than a width of each of the electrodes RME1 and RME2 measured in the one direction. The connection electrodes CNE1 and CNE2 may be in contact with one end and the other end of the light emitting element ED, respectively, to cover portions of upper surfaces of the first electrode RME1 and the second electrode RME2. However, the present disclosure is not limited thereto, and the connection electrodes CNE1 and CNE2 may have a width greater than that of the electrodes RME1 and RME2 to cover both sides of the electrodes RME1 and RME2.

The connection electrodes CNE1 and CNE2 may include a transparent conductive material. For example, the connection electrodes CNE1 and CNE2 may include ITO, IZO, ITZO, aluminum (Al), and/or the like. The light emitted from the light emitting element ED may be transmitted through the connection electrodes CNE1 and CNE2 and travel upward. However, the present disclosure is not limited thereto.

It has been illustrated in the drawings that two connection electrodes CNE1 and CNE2 are provided in each of the sub-pixels SPX1, SPX2, and SPX3, but the present disclosure is not limited thereto. The number of connection electrodes CNE1 and CNE2 may suitably vary depending on the number of electrodes RME1 and RME2 in each of the sub-pixels SPX1, SPX2 and SPX3.

A third insulating layer PAS3 is on the first connection electrode CNE1. The third insulating layer PAS3 may electrically insulate the first connection electrode CNE1 and the second connection electrode CNE2 from each other. The third insulating layer PAS3 may cover the first connection electrode CNE1, but may not be on the other end of the light emitting element ED so that the light emitting element ED may be in contact with the second connection electrode CNE2. The third insulating layer PAS3 may be in partial contact with the first connection electrode CNE1 and the second insulating layer PAS2 on an upper surface of the second insulating layer PAS2. A side surface of the third insulating layer PAS3 in a direction from the first electrode RME1 toward the second electrode RME2 may be aligned with one side surface of the second insulating layer PAS2. In some embodiments, the third insulating layer PAS3 may be on the non-emission area, for example, on the first insulating layer PAS1 on the via layer VIA. However, the present disclosure is not limited thereto.

The second connection electrode CNE2 is on the second electrode RME2, the second insulating layer PAS2, and the third insulating layer PAS3. The second connection electrode CNE2 may be in contact with the other end of the light emitting element ED and an exposed upper surface of the second electrode RME2. The other end of the light emitting element ED may be electrically connected (e.g., electrically coupled) to the second electrode RME2 through the second connection electrode CNE2.

The second connection electrode CNE2 may be in partial contact with the second insulating layer PAS2, the third insulating layer PAS3, the second electrode RME2, and the light emitting element ED. The first connection electrode CNE1 and the second connection electrode CNE2 may not be in contact with each other due to the second insulating layer PAS2 and the third insulating layer PAS3. However, the present disclosure is not limited thereto, and in some embodiments, the third insulating layer PAS3 may be omitted.

The first insulating layer PAS1, the second insulating layer PAS2, and the third insulating layer PAS3 described above may each independently include an inorganic insulating material or an organic insulating material. In one or more embodiments, the first insulating layer PAS1, the second insulating layer PAS2, and the third insulating layer PAS3 may include an inorganic insulating material such as silicon oxide ($SiO_x$), silicon nitride ($SiN_x$), silicon oxynitride ($SiO_xN_y$), aluminum oxide ($AlO_y$), and/or aluminum nitride ($AlN_x$). In one or more embodiments, the first insulating layer PAS1, the second insulating layer PAS2, and the third insulating layer PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, a benzocyclobutene, a cardo resin, a siloxane resin, a silsesquioxane resin, polymethyl methacrylate, polycarbonate, a polymethyl methacrylate-polycarbonate synthetic resin, and/or the like. However, the present disclosure is not limited thereto.

The wavelength control layer CWL may be on the light emitting element layer EL. According to one or more embodiments, the wavelength control layer CWL may be in areas surrounded by the bank BNL. The wavelength control layer CWL may be in each of the sub-pixels SPX1, SPX2, and SPX3, but may be in the emission areas EMA among the areas surrounded by the bank BNL and may not be in the sub-areas SA. The sub-areas SA are areas in which the light emitting elements ED of the light emitting element layer EL are not provided, and light may not be substantially emitted in the sub-areas SA. The wavelength control layer CWL may be in an area surrounded by the bank BNL, in an area in which the light emitting element ED is provided in the light emitting element layer EL.

In some embodiments, a height of the wavelength control layer CWL may be greater than the height of the bank BNL. The wavelength control layer CWL may be formed through the inkjet printing process among the processes of manufacturing the display device 10. The wavelength control layer CWL may be formed by jetting and applying a material constituting the wavelength control layer CWL in the areas surrounded by the bank BNL and then drying the material. As an example, the material constituting the wavelength control layer CWL may include an organic material to have viscosity, and even though the organic material is jetted or applied up to a position higher than the bank BNL, the organic material may not overflow into the other sub-pixels SPX1, SPX2, and SPX3 beyond the bank BNL. Accordingly, the height of the wavelength control layer CWL may be greater than that of the bank BNL. However, the present disclosure is not limited thereto.

As described above with reference to FIG. 5, the wavelength control layer CWL may include the first wavelength conversion layer WCL1 in the first sub-pixel SPX1, the second wavelength conversion layer WCL2 in the second sub-pixel SPX2, and the light transmitting layer TPL in the third sub-pixel SPX3.

The first wavelength conversion layer WCL1 may include a first base resin BRS1 and first wavelength conversion materials WCP1 dispersed in the first base resin BRS1. The second wavelength conversion layer WCL2 may include a second base resin BRS2 and second wavelength conversion materials WCP2 dispersed in the second base resin BRS2. The first wavelength conversion layer WCL1 and the second wavelength conversion layer WCL2 convert a wavelength of the light of the first color incident from the light emitting element layer EL and transmit the light having the converted wavelength therethrough. Scatterers SCP of the first wavelength conversion layer WCL1 and the second wavelength conversion layer WCL2 may increase wavelength conversion efficiency. The light transmitting layer TPL may include a third base resin BRS3 and scatterers SCP dispersed in the third base resin BSR3. The light transmitting layer TPL transmits the light of the first color incident from the light emitting element layer EL therethrough while maintaining the wavelength of the light of the first color. The scatterers SCP of the light transmitting layer TPL may serve to adjust an emission path of the light emitted through the light transmitting layer TPL. The light transmitting layer TPL may not include a wavelength conversion material. Hereinafter, a detailed description will not be provided, because it has been provided above.

The wavelength control layer CWL may be directly on the light emitting element layer EL. In the display device 10, the bank BNL has a height (e.g., a set or predetermined height) and may surround the sub-pixels SPX1, SPX2, and SPX3, and thus, the base resins BRS1, BRS2, and BRS3 of the wavelength control layer CWL may be directly on the third insulating layer PAS3 and the second connection electrode CNE2 of the light emitting element layer EL.

The base resins BRS1, BRS2, and BRS3 of the wavelength control layer CWL may surround the light emitting elements ED, the bank patterns BP, the electrodes RME, the connection electrodes CNE1 and CNE2, and the like, of the light emitting element layer EL in the areas surrounded by the bank BNL. In one or more embodiments, the scatterers SCP and the wavelength conversion materials WCP1 and WCP2 of the wavelength control layer CWL may be in each of the base resins BRS1, BRS2, and BRS3, and may be positioned around the light emitting element layer EL.

The first capping layer CPL1 may be on the wavelength control layer CWL. The first capping layer CPL1 may be on and may cover the wavelength control layer CWL. The first capping layer CPL1 may be between the color filter layer CFL and the wavelength control layer CWL. In one or more embodiments, the first capping layer CPL1 may cover the wavelength control layer CWL to prevent or reduce damage to or contamination of the wavelength control layer CWL.

A first light blocking member BK1 may be on the first capping layer CPL1. The first light blocking member BK1 may be between the wavelength control layers CWL. For example, the first light blocking member BK1 may be between the first wavelength conversion layer WCL1, the second wavelength conversion layer WCL2, and the light transmitting layer TPL. The first light blocking member BK may be in the non-emission areas NEA along the boundaries between the first to third sub-pixels SPX1, SPX2, and SPX3 on the first capping layer CPL1. The first light blocking member BK1 may overlap the bank BNL in the thickness direction (e.g., the third direction DR3) of the display device 10.

The first light blocking member BK1 may serve to not only block or reduce light emission, but also to suppress or reduce external light reflection. The first light blocking member BK1 may be formed in a lattice shape surrounding the emission areas EMA in plan view. The first light blocking member BK1 may not be in the emission area EMA of each of the sub-pixels SPX1, SPX2, and SPX3, and may be in the sub-area SA. For example, the first light blocking member BK1 may surround the emission areas EMA. In some embodiments, the first light blocking member BK1 may be formed to have a width smaller than that of the bank BNL. However, the present disclosure is not limited thereto, and the first light blocking member BK1 may be formed to have substantially the same width as the bank BNL.

The first light blocking member BK1 may include an organic material. In one or more embodiments, the first light blocking member BK1 may include a light absorbing material capable of absorbing a visible ray wavelength band. Because the first light blocking member BK1 includes the light absorbing material and is positioned along the boundaries between the first to third sub-pixels SPX1, SPX2, and SPX3, the first light blocking member BK1 may define the emission areas EMA.

The first overcoat layer OC1 may be on the first capping layer CPL1 and the first light blocking member BK1. The first overcoat layer OC1 may planarize a step of the first capping layer CPL1 and the first light blocking member BK1. The first overcoat layer OC1 may be made of the same material as the first overcoat layer OC1 described above with reference to FIG. 5, and a detailed description thereof will thus not be provided.

The second capping layer CPL2 may be on the first overcoat layer OC1. The second capping layer CPL2 may cover the first overcoat layer OC1 to protect a structure therebelow. A configuration of the second capping layer CPL2 is the same as that of the first capping layer CPL1, and a redundant description thereof will thus not be provided.

The color filter layer CFL may be on the second capping layer CPL2. The color filter layer CFL may include a first color filter CF1, a second color filter CF2, a third color filter CF3, and a second light blocking member BK2.

The first color filter CF1 may be in the emission area EMA of the first sub-pixel SPX1, the second color filter CF2 may be in the emission area EMA of the second sub-pixel SPX2, and the third color filter CF3 may be in the emission area EMA of the third sub-pixel SPX3. The first to third color filters CF1, CF2, and CF3 may be surrounded by the second light blocking member BK2. A configuration of the color filter layer CFL has been described above with reference to FIG. 5, and a redundant description thereof will thus not be provided.

The third capping layer CPL3 may be on the color filter layer CFL. The third capping layer CPL3 may be on and may cover the first to third color filters CF1, CF2, and CF3 and the second light blocking member BK2. The third capping layer CPL3 may serve to protect the color filter layer CFL.

The encapsulation layer ENL may be on the third capping layer CPL3. The encapsulation layer ENL may include at least one thin film encapsulation layer to protect members on the first substrate SUB1 from external moisture and/or oxygen. For example, the encapsulation layer ENL may be formed as a single encapsulation layer including an inorganic material, but is not limited thereto. When the encapsulation layer ENL includes the inorganic material, the inorganic material may include silicon nitride, silicon oxide, silicon oxynitride, and/or the like.

In one or more embodiments, the display device 10 may include a reflective layer RFL on the bank BNL described above, a first metal oxide layer MOL1 on the reflective layer RFL, and a self-assembled layer SAM on the metal oxide layer MOL1.

The reflective layer RFL may be on an upper surface and side surfaces of the bank BNL, and may be in contact with the upper surface and the side surfaces of the bank BNL. The reflective layer RFL may not overlap the emission areas EMA, and may overlap the non-emission areas NEM. The reflective layer RFL may overlap the bank BNL, the first light blocking member BK1, and the second light blocking member BK2.

The reflective layer RFL may serve to reflect light emitted from the wavelength control layer CWL. When the light emitted from the wavelength control layer CWL is incident on the bank BNL, the light may be partially absorbed by the bank BNL. In the present embodiments, the reflective layer RFL is formed on the bank BNL to reflect the light, such that light extraction efficiency may be improved.

The first metal oxide layer MOL1 may be on the reflective layer RFL. The first metal oxide layer MOL1 may be on an upper surface and side surfaces of the reflective layer RFL, and may be in contact with the upper surface and the side surfaces of the reflective layer RFL. The first metal oxide layer MOL1 may not overlap the emission areas EMA, and may overlap the non-emission areas NEM. The first metal oxide layer MOL1 may overlap the bank BNL, the first light blocking member BK1 and the second light blocking member BK2.

The self-assembled layer SAM may be on the first metal oxide layer MOL1. The self-assembled layer SAM may be on an upper surface and side surfaces of the first metal oxide layer MOL1, and may be in contact with the upper surface and the side surfaces of the first metal oxide layer MOL1. The self-assembled layer SAM may not overlap the emission areas EMA, and may overlap the non-emission areas NEM. The self-assembled layer SAM may overlap the bank BNL, the first light blocking member BK1, and the second light blocking member BK2.

The self-assembled layer SAM may serve to impart liquid repellency to an upper portion of the bank BNL to form the wavelength control layer CWL by an inkjet process. The self-assembled layer SAM is chemisorbed and formed on the surface of the first metal oxide layer MOL1, and may thus impart the liquid repellency to the bank BNL. Therefore, when the wavelength control layer CWL is formed by the inkjet process, it is possible to prevent or reduce the overflow and mixing of the ink with another ink in the adjacent sub-pixels SPX1, SPX2, and SPX3.

In the present embodiments, the light extraction efficiency may be improved by forming the reflective layer RFL on the bank BNL to prevent or reduce the absorption of the light into the bank BNL. In some embodiments, the color mixing may be prevented or reduced by forming the first metal oxide layer MOL1 and the self-assembled layer SAM on the bank BNL to prevent or reduce the overflow of the ink into the adjacent sub-pixels during the inkjet process for forming the wavelength control layer CWL.

Referring to FIG. 15, the light emitting element ED described above is a particle type element (e.g., particle-containing element), and may have a rod or cylindrical shape having an aspect ratio (e.g., a set or predetermined aspect ratio). The light emitting element ED may have a size of a nanometer scale (about 1 nm or more and less than about 1 μm) to a micrometer scale (about 1 μm or more and less than about 1 mm). In one or more embodiments, the light emitting element ED may have a size of a nanometer scale or have a size of a micrometer scale in both the length and the diameter. In some other embodiments, the diameter of the light emitting element ED may have a size of a nanometer scale, while the length of the light emitting element ED may have a size of a micrometer scale. In some embodiments, some of the light emitting elements ED may have sizes of a nanometer scale in diameter and/or length, while the others of the light emitting elements ED may have a size of a micrometer scale in diameter and/or length.

In one or more embodiments, the light emitting element ED may be an inorganic light emitting diode. For example, the light emitting element ED may include a semiconductor layer doped with conductivity-type (e.g., p-type or n-type) impurities. The semiconductor layer may receive an electrical signal applied from an external power source and emit the electrical signal as light in a set or corresponding wavelength band.

The light emitting element ED according to one or more embodiments may include a first semiconductor layer 31, a light emitting layer 33, and a second semiconductor layer 32, and an electrode layer 37 that are sequentially stacked in a length direction. The light emitting element may further include an insulating film 38 surrounding outer surfaces of the first semiconductor layer 31, the second semiconductor layer 32, and the light emitting layer 33.

The first semiconductor layer 31 may be an n-type semiconductor. When the light emitting element ED emits light in a blue wavelength band, the first semiconductor layer 31 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and/or InN, each doped with an n-type dopant. The first semiconductor layer 31 may be doped with an n-type dopant, which may be Si, Ge, Sn, and/or the like. For example, the first semiconductor layer 31 may be made of n-GaN doped with n-type Si. A length of the first semiconductor layer 31 may be in the range of about 1.5 μm to about 5 μm, but is not limited thereto.

The second semiconductor layer 32 may be on a light emitting layer 33 to be described herein below. The second semiconductor layer 32 may be a p-type semiconductor, and when the light emitting element ED emits light in a blue or green wavelength band, the second semiconductor layer 32 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and/or InN, each doped with a p-type dopant. The second semiconductor layer 32 may be doped with a p-type dopant, which may be Mg, Zn, Ca, Se, Ba, and/or the like. For example, the second semiconductor layer 32 may be made of p-GaN doped with p-type Mg. A length of the second semiconductor layer 32 may be in the range of about 0.05 μm to about 0.10 μm, but is not limited thereto.

Although it has been illustrated in FIG. 15 that the first semiconductor layer 31 and the second semiconductor layer 32 are configured as one layer, the present disclosure is not limited thereto. The first semiconductor layer 31 and the second semiconductor layer 32 may further include a larger number of layers, for example, a clad layer and/or a tensile strain barrier reducing (TSBR) layer, according to a material of the light emitting layer 33.

The light emitting layer 33 may be between the first semiconductor layer 31 and the second semiconductor layer 32. The light emitting layer 33 may include a material having a single or multiple quantum well structure. When the light emitting layer 33 includes the material having the multiple quantum well structure, the light emitting layer 33 may have a structure in which a plurality of quantum layers and well layers are alternately stacked. The light emitting layer 33 may emit light by a combination of electron-hole pairs according to an electrical signal applied through the first semiconductor layer 31 and the second semiconductor layer 32. When the light emitting layer 33 emits light in a blue wavelength band, the light emitting layer 33 may include a material such as AlGaN and/or AlGaInN. For example, when the light emitting layer 33 has the multiple quantum well structure, for example, the structure in which the quantum layers and the well layers are alternately stacked, the quantum layers may include a material such as AlGaN and/or AlGaInN, and the well layers may include a material such as GaN and/or AlInN. For example, the light emitting layer 33 includes AlGaInN as a material of the quantum layers and AlInN as a material of the well layers, such that the light emitting layer 33 may emit blue light having a central wavelength band of about 450 nm to about 495 nm, as described above.

However, the present disclosure is not limited thereto, and the light emitting layer 33 may have a structure in which semiconductor materials having large band gap energy and semiconductor materials having small band gap energy are alternately stacked, and may include other Group III to Group V semiconductor materials according to a wavelength band of emitted light. The light emitted by the light emitting layer 33 is not limited to the light in the blue wavelength band, and in some embodiments, the light emitting layer 33 may emit light in a red and green wavelength band. A length of the light emitting layer 33 may be in the range of about 0.05 μm to about 0.10 μm, but is not limited thereto.

The light emitted from the light emitting layer 33 may be emitted not only to outer surfaces of the light emitting element ED in the length direction, but also to both side surfaces of the light emitting element ED. A direction of the light emitted from the light emitting layer 33 is not limited to one direction.

The electrode layer 37 may be an ohmic connection electrode. However, the present disclosure is not limited thereto, and the electrode layer 37 may also be a Schottky connection electrode. The light emitting element ED may include at least one electrode layer 37. It has been illustrated in FIG. 15 that the light emitting element ED includes one electrode layer 37, but the present disclosure is not limited thereto. In some embodiments, the light emitting element ED may include a larger number of electrode layers 37, or the electrode layer 37 may be omitted. A description for a light emitting element ED to be provided herein below may be similarly applied even though the number of electrode layers 37 is changed or the light emitting element ED further includes another structure.

The electrode layer 37 may decrease resistance between the light emitting element ED and the electrode or the connection electrode when the light emitting element ED is electrically connected (e.g., electrically coupled) to the electrode or the connection electrode in the display device 10 according to one or more embodiments. The electrode layer 37 may include a conductive metal. The electrode layer 37 may include at least one selected from aluminum (Al), titanium (Ti), indium (In), gold (Au), silver (Ag), indium tin oxide (ITO), indium zinc oxide (IZO), and indium tin zinc oxide (ITZO). The electrode layer 37 may include an n-type or p-type doped semiconductor material. The electrode layer 37 may include the same material or include different materials, but is not limited thereto.

The insulating film 38 may surround outer surfaces of the plurality of semiconductor layers and the electrode layers described above. For example, the insulating film 38 may surround at least an outer surface of the light emitting layer 33, and may extend in one direction in which the light emitting element ED extends. The insulating film 38 may serve to protect the first semiconductor layer 31, the second semiconductor layer 32, the light emitting layer 33, and the electrode layer 37. The insulating film 38 may be formed to surround side surface portions of the first semiconductor layer 31, the second semiconductor layer 32, the light emitting layer 33, and the electrode layer 37, but may be formed to expose both ends of the light emitting element ED in the length direction thereof.

It has been illustrated in FIG. 15 that the insulating film 38 is formed to extend in the length direction of the light emitting element ED to cover side surfaces of the first semiconductor layer 31 to the electrode layer 37, but the present disclosure is not limited thereto. The insulating film 38 may cover only outer surfaces of the light emitting layer 33 and a portion of the semiconductor layer or cover only a portion of an outer surface of the electrode layer 37, such that a portion of the outer surface of the electrode layer 37 may be partially exposed. In one or more embodiments, the insulating film 38 may also be formed so that an upper surface thereof has a round cross section in an area adjacent to at least one end of the light emitting element ED.

A thickness of the insulating film 38 may be in the range of about 10 nm to about 1.0 μm, but is not limited thereto. The thickness of the insulating film 38 may be about 40 nm.

The insulating film 38 may include materials having insulating properties, such as silicon oxide ($SiO_x$), silicon nitride ($SiN_x$), silicon oxynitride ($SiO_xN_y$), aluminum nitride (AlN), and/or aluminum oxide ($Al_xO_y$). Accordingly, risk of an electrical short circuit that may occur when the light emitting layer 33 is in direct contact with an electrode through which an electrical signal is transferred to the light emitting element ED may be prevented or reduced. In addition, the insulating film 38 protects an outer surface of the light emitting element ED as well as the light emitting layer 33, and may thus prevent or reduce a decrease in luminous efficiency.

In one or more embodiments, an outer surface of the insulating film 38 may be surface-treated. The light emitting elements ED may be jetted onto the electrodes in a state in which they are dispersed in an ink (e.g., a set or predetermined ink), and may be aligned. Here, to maintain the light emitting element ED in a state in which the light emitting element ED is dispersed without being agglomerated with other adjacent light emitting elements ED in the ink, a hydrophobic or hydrophilic treatment may be performed on a surface of the insulating film 38. For example, the outer surface of the insulating film 38 may be surface-treated with a material such as stearic acid and/or 2,3-naphthalene dicarboxylic acid.

Hereinafter, embodiments will be described in more detail through Preparation Example and Experimental Examples.

Preparation Example: Preparation of Sample Substrates

Sample substrates were prepared by stacking each of an Al thin film, an ITO/Ag/ITO thin film, a SiNx thin film, and an SiOx thin film on each of glass substrates.

Experimental Example 1: Measurement of Surface Contact Angle of Dodecanethiol

A methyl ethyl benzoate solution was dropped on each of the sample substrates and contact angles of the methyl ethyl benzoate solution were measured. In this case, conditions such as before a self-assembled layer is formed on each of the sample substrates, after a self-assembled layer is formed on each of the sample substrates, and after a self-assembled layer is cleaned and baked were set, and surface contact angles of the methyl ethyl benzoate solution were measured. Here, a phrase "after a self-assembled layer is formed" refers to a state in which the sample substrates were immersed in a Xylene solution, with which dodecanethiol is mixed, for about 15 minutes and then taken out, and a phrase "after a self-assembled layer is cleaned and baked" refers to a state in which the taken-out sample substrates are baked at about 120° C. for about 120 seconds, cleaned with Xylene, and baked again under the same condition.

Results of dropping a methyl ethyl benzoate solution before the self-assembled layer is formed on each of the sample substrates, after the self-assembled layer is formed on each of the sample substrates, and after the self-assembled layer is cleaned and baked and measuring contact angles are shown in Table 1.

TABLE 1

| | Condition | | |
|---|---|---|---|
| Sample thin film | Before self-assembled layer is formed | After self-assembled layer is formed | After self-assembled layer is cleaned and baked |
| Al | 9.5° | 42.2° | 37.7° |
| ITO/Ag/ITO | 14.4° | 54.6° | 47.7° |
| SiNx | 3.0° | 25.0° | 27.4° |
| SiOx | 3.0° | 3.0° | 8.4° |

Referring to Table 1, surface contact angles of the methyl ethyl benzoate solution were larger in the sample substrate on which the ITO/Ag/ITO thin film was formed than in the sample substrates on which the Al, SiNx, and SiOx thin films were formed, under all conditions.

Experimental Example 2: Measurement of Surface Contact Angle of Trimethoxy(1H,1H,2H,2H-heptadecafluorodecyl)silane Experimental Example 2 was different from Experimental Example 1 only in that a self-assembled layer was formed with Trimethoxy(1H,1H,2H,2H-heptadecafluorodecyl)silane, under the same conditions as in Experimental Example 1 described above.

Results of dropping a methyl ethyl benzoate solution before the self-assembled layer is formed on each of the sample substrates, after the self-assembled layer is formed on each of the sample substrates, and after the self-assembled layer is cleaned and baked and measuring contact angles are shown in Table 2.

TABLE 2

| Sample thin film | Condition | | |
|---|---|---|---|
| | Before self-assembled layer is formed | After self-assembled layer is formed | After self-assembled layer is cleaned and baked |
| Al | 9.5° | 70.8° | 64.3° |
| ITO/Ag/ITO | 14.4° | 69.3° | 68.6° |
| SiNx | 3.0° | 53.5° | 49.7° |
| SiOx | 3.0° | 8.6° | 3.0° |

Referring to Table 2, even though a material of the self-assembled layer is changed, surface contact angles of the methyl ethyl benzoate solution were larger, and in one condition, substantially similar, in the sample substrate on which the ITO/Ag/ITO thin film was formed than in the sample substrates on which the Al, SiNx, and SiOx thin films were formed.

It could be confirmed through Experimental Examples 1 and 2 described above that the self-assembled layer had better liquid repellent properties on an ITO surface than on surfaces of metal or inorganic insulating films.

In concluding the detailed description, those skilled in the art will appreciate that many variations and modifications can be made to the present embodiments without substantially departing from the principles of the present disclosure. Therefore, the disclosed embodiments of the present disclosure are used in a generic and descriptive sense only and not for purposes of limitation.

What is claimed is:

1. A color changing substrate comprising:
   a substrate comprising emission areas and non-emission areas;
   a color filter layer on the substrate and comprising a light blocking member partitioning the emission areas and the non-emission areas, and color filters in areas surrounded by the light blocking member;
   a bank overlapping the light blocking member;
   a wavelength control layer comprising wavelength conversion layers and a light transmitting layer in areas surrounded by the bank;
   a reflective layer overlapping the bank;
   a first metal oxide layer overlapping the reflective layer; and
   a self-assembled layer overlapping the first metal oxide layer.

2. The color changing substrate of claim 1, wherein the first metal oxide layer covers the reflective layer, and the self-assembled layer covers the first metal oxide layer.

3. The color changing substrate of claim 1, wherein the reflective layer, the first metal oxide layer, and the self-assembled layer overlap the non-emission areas and do not overlap the emission areas.

4. The color changing substrate of claim 3, wherein the reflective layer, the first metal oxide layer, and the self-assembled layer overlap the light blocking member.

5. The color changing substrate of claim 1, wherein the first metal oxide layer comprises any one selected from ITO, IZO, ZnO, $In_2O_3$, and ITZO.

6. The color changing substrate of claim 1, wherein the first metal oxide layer has a thickness in a range of about 10 Å to about 500 Å.

7. The color changing substrate of claim 1, further comprising a second metal oxide layer between the bank and the reflective layer, and comprising a same material as the first metal oxide layer.

8. The color changing substrate of claim 1, wherein the self-assembled layer comprises a compound comprising hydrocarbon chains, head portions at first ends of the respective hydrocarbon chains, and terminal portions at second ends of the respective hydrocarbon chains.

9. The color changing substrate of claim 8, wherein the head portions are in contact with a surface of the first metal oxide layer, and
   wherein the terminal portions are spaced apart from the first metal oxide layer in a direction away from the first metal oxide layer.

10. The color changing substrate of claim 8, wherein the compound is represented by Chemical Formula 1:

wherein A is one or more selected from the group consisting of a thiol group, a disulfide group, a carboxylic acid group, a phosphonic acid group, and a silane group,
   wherein B is one or more selected from the group consisting of a fluoroalkylene group, an alkylene group, an acylene group, an amine group, a carboxylic acid group, a thiol group, and an ether group,
   wherein C is one or more selected from the group consisting of a fluoroalkyl group, an alkyl group, an acyl group, an amine group, a carboxylic acid group, a thiol group, and an alcohol group,
   wherein B comprises one or more fluoro groups, and
   wherein C comprises one or more fluoro groups.

11. A display device comprising:
   a display substrate comprising a first substrate comprising sub-pixels and a light emitting element layer on the first substrate and configured to emit light; and
   a color changing substrate on the display substrate,
   wherein the color changing substrate comprises:
      a second substrate comprising emission areas and non-emission areas respectively corresponding to the sub-pixels;
      a color filter layer on one surface of the second substrate facing the first substrate, and comprising a light blocking member partitioning the emission areas and the non-emission areas, and color filters in areas surrounded by the light blocking member;
      a bank overlapping the light blocking member;
      a wavelength control layer comprising wavelength conversion layers and a light transmitting layer in areas surrounded by the bank;
      a reflective layer overlapping the bank;
      a metal oxide layer overlapping the reflective layer; and
      a self-assembled layer overlapping the metal oxide layer.

12. The display device of claim 11, wherein the light emitting element layer comprises:
   pixel electrodes,
   a pixel defining layer partitioning the emission areas and the non-emission areas on the pixel electrodes,
   light emitting layers on the pixel electrodes, and
   a common electrode on the light emitting layers.

13. The display device of claim 12, wherein the bank, the reflective layer, the metal oxide layer, and the self-assembled layer overlap the pixel defining layer, and overlap the non-emission areas.

14. The display device of claim 11, wherein the sub-pixels comprise a first sub-pixel, a second sub-pixel, and a third sub-pixel,
- wherein the wavelength conversion layers comprise a first wavelength conversion layer in the first sub-pixel, and a second wavelength conversion layer in the second sub-pixel, and
- wherein the light transmitting layer is in the third sub-pixel.

15. The display device of claim 14, wherein the color filters comprise a first color filter in the first sub-pixel, a second color filter in the second sub-pixel, and a third color filter in the third sub-pixel, and
- wherein the light emitted from the light emitting element layer is to be converted into light of a first color in the first wavelength conversion layer and then is to be emitted through the first color filter, is to be converted into light of a second color in the second wavelength conversion layer and then is to be emitted through the second color filter, or is to be transmitted through the light transmitting layer and then is to be emitted through the third color filter.

16. The display device of claim 11, wherein the metal oxide layer comprises any one selected from ITO, IZO, ZnO, $In_2O_3$, and ITZO.

17. The display device of claim 11, wherein the self-assembled layer comprises a compound comprising hydrocarbon chains, head portions at first ends of the respective hydrocarbon chains, and terminal portions at second ends of the respective hydrocarbon chains,
- wherein the head portions are in contact with a surface of the metal oxide layer, and
- wherein the terminal portions are spaced apart from the metal oxide layer in a direction away from the metal oxide layer.

18. The display device of claim 17, wherein the compound is represented by Chemical Formula 1:

A-B-C   Chemical Formula 1 wherein A is one or more selected from the group consisting of a thiol group, a disulfide group, a carboxylic acid group, a phosphonic acid group, and a silane group, wherein B is one or more selected from the group consisting of a fluoroalkylene group, an alkylene group, an acylene group, an amine group, a carboxylic acid group, a thiol group, and an ether group, wherein C is one or more selected from the group consisting of a fluoroalkyl group, an alkyl group, an acyl group, an amine group, a carboxylic acid group, a thiol group, and an alcohol group, wherein B comprises one or more fluoro groups, and wherein C comprises one or more fluoro groups.

\* \* \* \* \*